(12) United States Patent
Perrott

(10) Patent No.: US 12,381,567 B2
(45) Date of Patent: Aug. 5, 2025

(54) DIGITAL-TO-TIME CONVERTER CALIBRATION

(71) Applicant: TEXAS INSTRUMENTS INCORPORATED, Dallas, TX (US)

(72) Inventor: Michael Henderson Perrott, Nashua, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 104 days.

(21) Appl. No.: 18/193,870

(22) Filed: Mar. 31, 2023

(65) Prior Publication Data

US 2024/0223201 A1 Jul. 4, 2024

Related U.S. Application Data

(60) Provisional application No. 63/478,050, filed on Dec. 30, 2022.

(51) Int. Cl.
*H03M 1/10* (2006.01)
*G04F 10/00* (2006.01)
(Continued)

(52) U.S. Cl.
CPC ........ *H03M 1/1033* (2013.01); *G04F 10/005* (2013.01); *H03K 5/13* (2013.01); *H03K 2005/00019* (2013.01)

(58) Field of Classification Search
CPC ...... H03M 1/1033; G04F 10/005; H03K 5/13; H03K 2005/00019
See application file for complete search history.

(56) References Cited

U.S. PATENT DOCUMENTS 8,860,514 B2 10/2014 Weltin-Wu et al.
8,994,573 B2 3/2015 Henzler et al.
(Continued)

FOREIGN PATENT DOCUMENTS

CN 114710154 A 7/2022
EP 2782255 A1 9/2014
KR 2022023196 A 3/2022

OTHER PUBLICATIONS

Search Report for PCT Patent Application No. PCT/US2022/012085 date of mailing of the international search report Apr. 7, 2022 (Apr. 7, 2022), 1 page.
(Continued)

*Primary Examiner* — Khai M Nguyen
(74) *Attorney, Agent, or Firm* — Frank D. Cimino

(57) ABSTRACT

In one example, an apparatus includes a MM divider having a clock input, a first divisor input and a MM divider output; a delta-sigma modulator having a second divisor input, a divisor output and a residual output, the divisor output coupled to the first divisor input; a DTC having a clock input, a control input, a calibration input, and an output, the DTC control input coupled to the residual output, and the DTC clock input coupled to the MM divider output; and a calibration circuit having a first calibration control input, a second calibration control input, and a calibration output, the first calibration control input coupled to the DTC output, the second calibration control input coupled to the residual output, and the calibration output coupled to the DTC calibration input.

21 Claims, 19 Drawing Sheets

(51) Int. Cl.
*H03K 5/00* (2006.01)
*H03K 5/13* (2014.01)

(56) References Cited

U.S. PATENT DOCUMENTS

| | | | |
|---|---|---|---|
| 9,455,667 B2 | 9/2016 | Machogiannakis et al. | |
| 9,678,481 B1 * | 6/2017 | Gao | H03M 1/1009 |
| 10,511,315 B1 | 12/2019 | Sarda | |
| 10,594,329 B1 | 3/2020 | Elkholy | |
| 10,707,883 B2 | 7/2020 | Elkholy | |
| 10,819,353 B1 | 10/2020 | Monk et al. | |
| 10,826,507 B1 | 11/2020 | Gong et al. | |
| 10,895,850 B1 | 1/2021 | Elkholy | |
| 11,201,626 B1 * | 12/2021 | Jung | H03L 7/0891 |
| 11,271,584 B2 | 3/2022 | Choi et al. | |
| 11,387,833 B1 | 7/2022 | Li et al. | |
| 2008/0001642 A1 | 1/2008 | Yun et al. | |
| 2008/0042766 A1 | 2/2008 | Tarng et al. | |
| 2009/0015338 A1 | 1/2009 | Frey | |
| 2010/0183091 A1 | 7/2010 | Wang et al. | |
| 2011/0148488 A1 | 6/2011 | Lee et al. | |
| 2013/0223564 A1 | 8/2013 | Mayer et al. | |
| 2016/0373120 A1 | 12/2016 | Caffee et al. | |
| 2020/0076440 A1 | 3/2020 | Ng et al. | |
| 2022/0014208 A1 | 1/2022 | Choi et al. | |
| 2022/0224344 A1 | 7/2022 | Perrott | |
| 2022/0224348 A1 | 7/2022 | Perrott et al. | |

OTHER PUBLICATIONS

Hung, Szu-Yao et al., "16.4 A 0.5-to-2.5GHz Multi-Output Fractional Frequency Synthesizer with 90fs Jitter and -106dBc Spurious Tones Based on Digital Spur Cancellation" 2019 IEEE International Solid-State Circuits Conference, Session 16, Feb. 19, 2019, pp. 262-263, US.

Wang, Bindi et al., "A Digital to Time Converter with Fully Digital Calibration Scheme for Ultra-Low Power ADPLL in 40 nm CMOS", 2015 IEEE International Symposium on Circuits and Systems (ISCAS), May 24-27, 2015, pp. 2289-2292, Portugal.

Wu, Wanghua et al., "A 28-nm 75-fsrms Analog Fractional-N Sampling PLL With a Highly Linear DTC Incorporating Background DTC Gain Calibration and Reference Clock Duty Cycle Correction", IEEE Journal of Solid-State Circuits, vol. 54, Issue 5, May 2019, pp. 1254-1265, US.

* cited by examiner

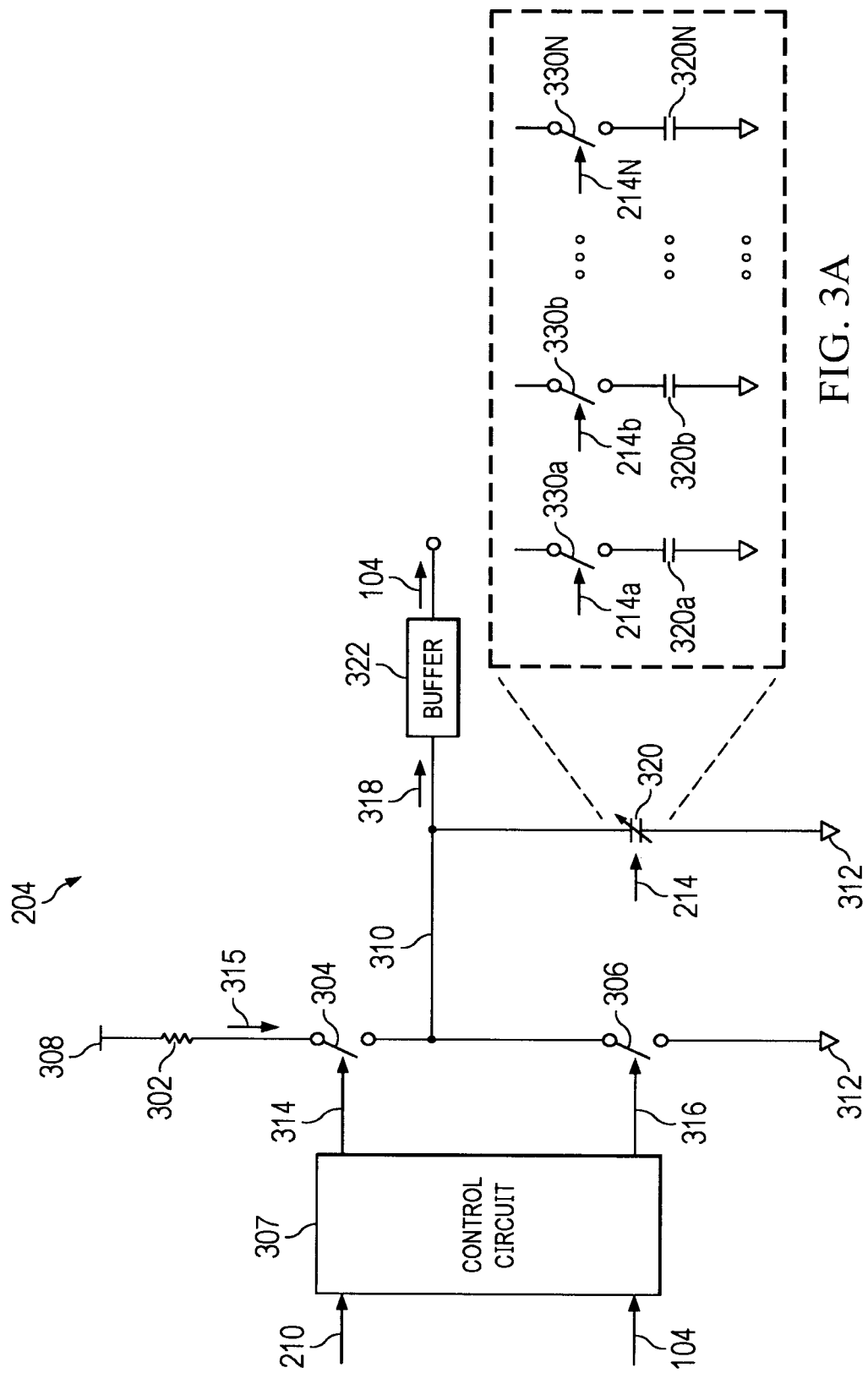

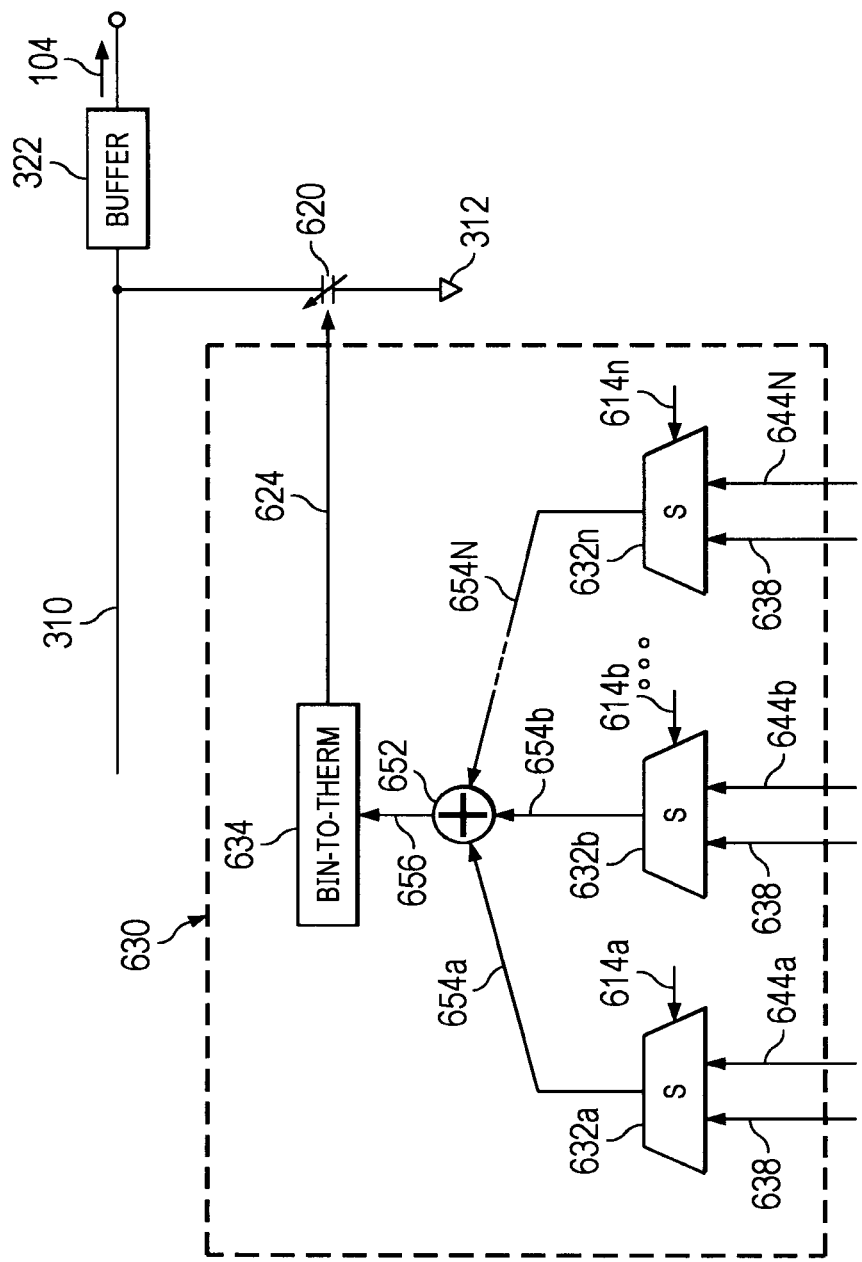

DIGITAL-TO-TIME CONVERTER
CALIBRATION

RELATED APPLICATIONS

The present application claims priority from U.S. Provisional Patent Application No. 63/478,050, titled "Digital-to-time Converter Calibration," filed on Dec. 30, 2022, and is related to U.S. application Ser. No. 18/092,091, titled "Frequency Multiplier Calibration," filed on Dec. 30, 2022, both of which are incorporated herein by reference in their entireties.

BACKGROUND

Various electrical components in an electronic system operate at different clock frequencies. As a result, a first clock signal having a first frequency may be divided to form a second clock signal having a second frequency. Some approaches to performing this division may be limited in their usefulness.

SUMMARY

In some examples, an apparatus include a multi-modulus (MM) divider, a delta-sigma modulator, and a digital-to-time converter (DTC), and a processing circuit. The MM divider has a clock input, a first divisor input and a MM divider output. The delta-sigma modulator has a second divisor input, a divisor output and a residual output, the divisor output coupled to the first divisor input. The DTC has a DTC clock input, a DTC control input, a DTC calibration input, and a DTC output, the DTC clock input coupled to the MM divider output. The DTC includes a set of main delay elements coupled to the DTC output, each main delay element having a main control terminal coupled to the DTC control input. The DTC also includes a set of auxiliary delay elements coupled to the DTC output, each auxiliary delay element having an auxiliary control terminal coupled to the DTC calibration input, and each auxiliary delay element controllable to combine with a respective one of the main delay elements to set a delay between DTC clock input and the DTC output. The processing circuit has a residual input, a main code output, and a correction code output, the residual input coupled to the residual output, the main code output coupled to the DTC control input, and the correction code output coupled to the DTC calibration input. The processing circuit is configured to, responsive to a residual signal at the residual input, provide a main code at the main code output and a correction code at the correction code output.

In some examples, an apparatus includes a MM divider, a delta-sigma modulator, a DTC, and a calibration circuit. The MM divider has a clock input, a first divisor input and a MM divider output. The delta-sigma modulator has a second divisor input, a divisor output and a residual output, the divisor output coupled to the first divisor input. The DTC has a DTC clock input, a DTC control input, a DTC calibration input, and a DTC output, the DTC control input coupled to the residual output, and the DTC clock input coupled to the MM divider output. The calibration circuit has a first calibration control input, a second calibration control input, and a calibration output, the first calibration control input coupled to the DTC output, the second calibration control input coupled to the residual output, and the calibration output coupled to the DTC calibration input. The calibration circuit is configured to receive a clock signal at the first calibration control input, receive a residual signal at the second calibration control input, and provide a calibration signal at the calibration output responsive to at least one of a time difference between a first edge of the clock signal and a second edge of a delayed version of the clock signal, and the residual signal.

BRIEF DESCRIPTION OF THE DRAWINGS

FIG. 3A and FIG. 3B are schematics of a digital-to-time converter (DTC) of a clock divider, in accordance with various examples.

FIG. 6A, FIG. 6B, FIG. 6C, and FIG. 6D are schematics of components that supports correction of transfer characteristic deviations, in accordance with various examples.

In this description, the same reference numbers depict same or similar (by function and/or structure) features. The drawings are not necessarily drawn to scale.

DETAILED DESCRIPTION

Figure 1:
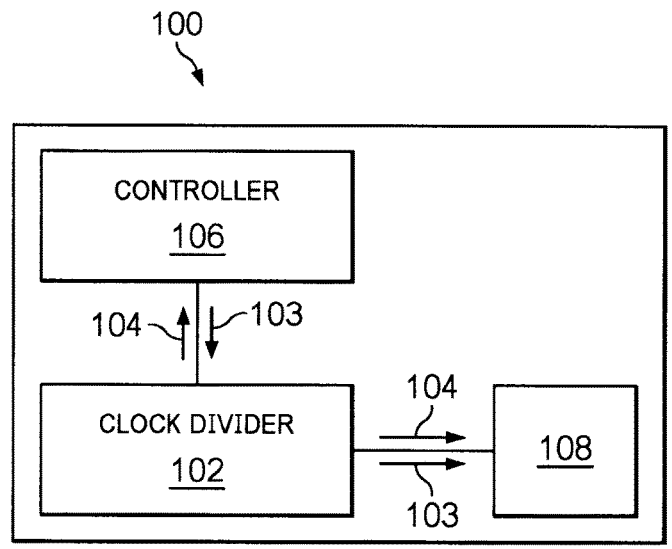
FIG. 1 is a schematic of an electronic device, in accordance with various examples.

FIG. 1 is a schematic of an electronic device 100, in accordance with various examples. The electronic device 100 may be any suitable device, the scope of which is not limited herein. For example, the electronic device 100 may be a device in which it is useful to have a second clock signal having a second frequency that varies from a first frequency of a first clock signal, such as via frequency division techniques or frequency multiplication techniques. Accordingly, the electronic device 100 includes a clock divider 102. Clock divider can receive a clock signal 103, and generate a clock signal 104 by performing a frequency division on clock signal 103, so that the frequency of clock signal 104 is divided down from the frequency of clock signal 103.

The electronic device 100 also includes a controller 106. Controller 106 may be coupled to the clock divider 102 and provide various control signals or other data to the clock divider 102. The control signals may include, for example, a reference clock signal as clock signal 103. The control signals may also indicate a target frequency of an output clock signal of the clock divider 102, or a value by which the clock divider 102 is to divide the input clock signal to provide the output clock signal. In other examples, the reference clock is provided by another component (not shown) such as an oscillator, a phase locked loop, or other types of frequency synthesizers. In some examples, the controller 106 receives the output clock signal from the clock divider 102. Also, the electronic device 100 includes a component 108. The component 108 may couple to the clock divider 102 and receive clock signal 104 from the clock divider 102. In some examples, the component 108 may also receive clock signal 103 from the clock divider 102, and the component 108 may utilize the clock signal 103, the clock signal 104 that is divided down from clock signal 103, or both. In various examples, the component 108 is any suitable component, such as a radio transceiver, a frequency divider, a phase-locked loop, a frequency synthesizer, a component useful in communication or other signaling, or any other component which may benefit from receiving an output clock signal having a frequency that varies from the input clock.

In some examples, clock divider 102 can perform integer frequency division on clock signal 103 to generate clock signal 104, so that the frequency of clock signal 103 is an integer multiple of the frequency of clock signal 104. Clock divider 102 may be programmable (e.g., by controller 106) to generate different clock signals 104 having different frequencies from clock signal 104. To provide finer resolution between the different frequencies, clock divider 102 may include a fractional output divider (FOD) to perform fractional frequency division on clock signal 103.

Figure 2:
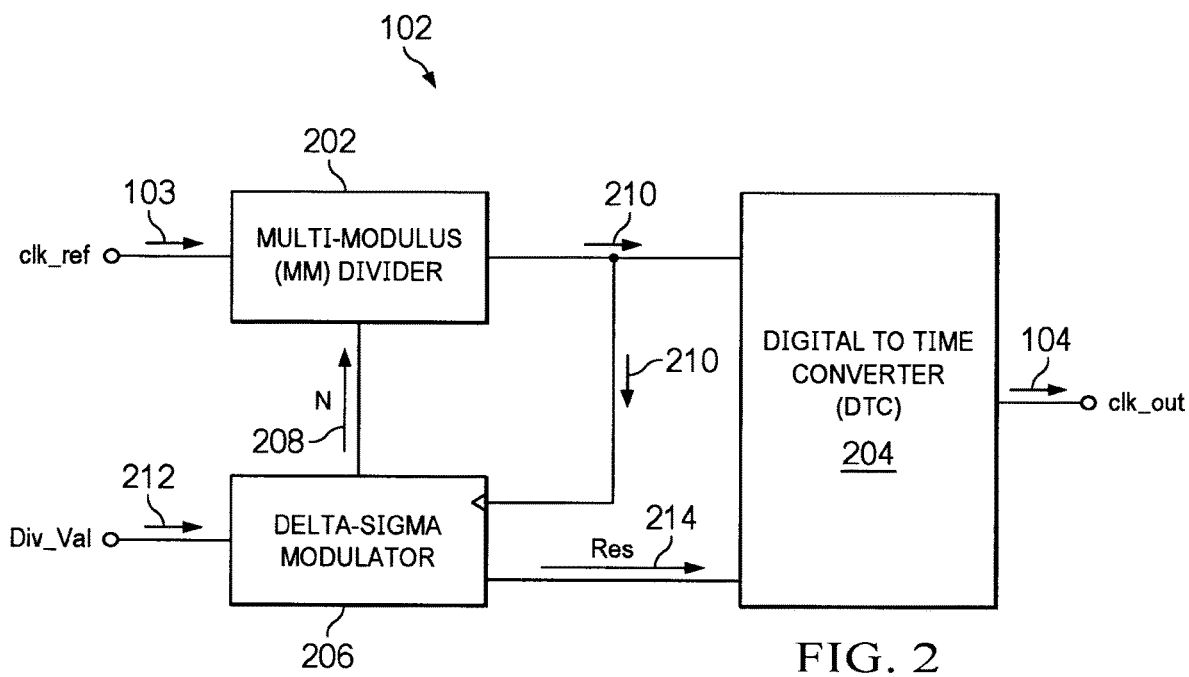
FIG. 2 is a schematic of a clock divider, in accordance with various examples.

FIG. 2 is a schematic of an example clock divider 102 that supports fractional frequency division that is representative of an FOD implementation, in accordance with various examples. Referring to FIG. 2, clock divider 102 includes a multi-modulus (MM) divider 202, a digital-to-time converter (DTC), and a digital delta-sigma modulator 206. In some examples, the MM divider 202 has a first input to receive an input clock signal, such as clock signal 103. The MM divider 202 also has a second input and an output. MM divider 202 receives a control signals 208 representing an integer divide value (also labelled N in FIG. 2) at the second input. MM divider 202 provides an intermediate divided clock signal 210 at the output by dividing the clock signal 103 by the divide value, such that the intermediate divided clock signal 210 has an instantaneous frequency equal to the frequency of clock signal 103 divided by the divide value N and an average frequency equal to the frequency of clock signal 103 divided by the Div_Val, in which Div_Val may include a fractional component as discussed below.

Also delta-sigma modulator 206 has a first input to receive a control signals 212 representing a divide value that includes integer and fractional components (also labelled Div_Val in FIG. 2). The divide value may be in a digital format or domain and is converted by the delta-sigma modulator 206 to a sequence of integer divide values N, such that the average of the sequence corresponds to Div_Val. Delta-sigma modulator 206 has a first output coupled to the second input of the MM divider 202 and provides a sequence of control signals 208 representing different integer divide values N based on Div_Val. Also, in generating the integer divide values N from Div_Val, delta-sigma modulator 206 may compute a residual error signal (Res). The residual error can represent a phase or time difference between the intermediate divided clock signal 210 and a target divided clock signal that has the same frequency as the average frequency of divided clock signal 210. The delta-sigma modulator 206 also includes a second input coupled to the output of the MM divider 202 to receive intermediate divided clock signal 210, from which the delta-sigma modulator 206 can compute Res and N values. In some examples, the delta-sigma modulator 206 may also receive the clock signal 104 (not shown in FIG. 2), and compute the Res and N values based on the clock signal 104. Delta-sigma modulator 206 also includes a second output to provide a control signals 214 representing the Res value.

DTC 204 has a first input coupled to the output of the MM divider 202 to receive intermediate divided clock signal 210, and a second input (a control input) coupled to the second output of Delta-sigma modulator 206 to receive control signals 214 representing the Res value. DTC 204 can generate clock signal 104 (also labelled clk_out in FIG. 2) by adding a delay to intermediate divided clock signal 210. Also, DTC 204 can adjust the delay to different cycle periods of intermediate divided clock signal 210 based on the Res values to modulate the instantaneous frequency of clock signal 104, and to correct the residual error. Such arrangements can reduce the jitter of clock signal 104 due to the residual error.

Figure 3B:
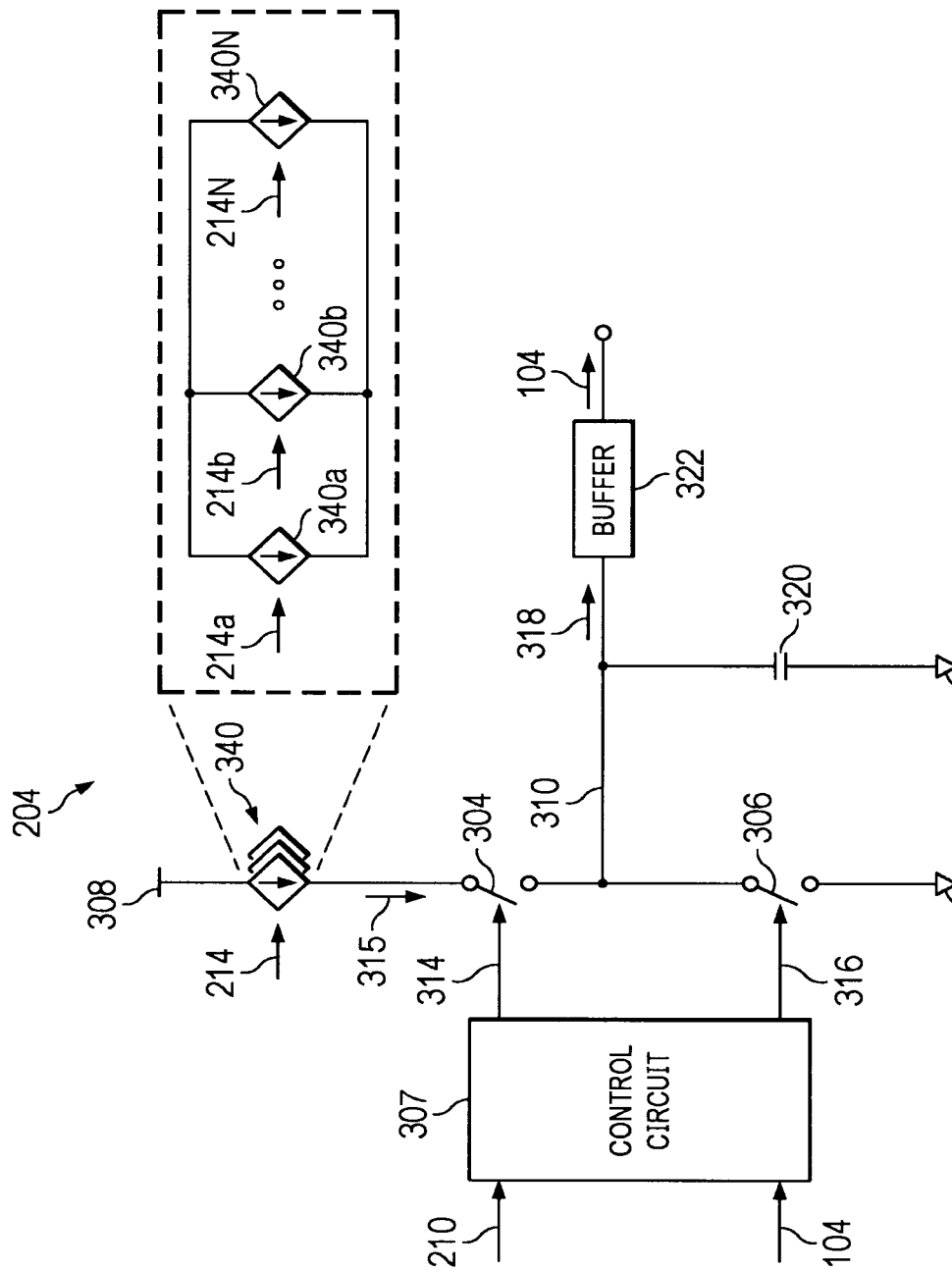

FIG. 3A and FIG. 3B are schematics illustrating internal components of DTC 204, in accordance with various examples. FIG. 3A is an example of an RC mode DTC 204. Referring to FIG. 3A, DTC 204 can include a resistor 302, a switch 304, a switch 306, and a control circuit 307. Resistor 302 and switch 304 can be coupled between a power supply terminal 308 and a ramp node 310 and switch 306 can be coupled between ramp node 310 and a ground terminal 312. DTC 204 includes a variable capacitor 320 coupled between ramp node 310 and ground terminal 312. In some examples, variable capacitor 320 can be coupled between ramp node 310 and power supply terminal 308. DTC 204 also includes a buffer 322 coupled between ramp node 310 and the output of DTC 204. In some examples, connections to power supply terminal 308 and ground terminal 312 are interchanged such that resistor 302 is coupled to ground terminal 312, switch 306 is coupled to power supply terminal 308, etc. For simplicity, all discussions will assume coupling to power supply terminal 308 and ground terminal 312 as shown in FIG. 3A with the understanding that such coupling can be interchanged. Control circuit 307 can receive intermediate divided clock signal 210 and clock signal 104, and provide control signals 314 and 316 to control, respectively, switches 304 and 306. For the rest of the disclosure, a switch can include a transistor, such as a Metal Oxide Silicon Field Effect Transistor (MOSFET), a bipolar junction transistor (BJT), etc., that has two current terminals and a control terminal. Based on a state of the control terminal, the transistor can be enabled to close the switch, in which the two current terminals are electrically connected together, or the transistor can be disabled to open the switch, in which the two current terminals can be electrically disconnected from one another.

Resistor 302 and switch 304 can provide a pull-up path, where if switch 304 is enabled, a power source coupled to power supply terminal 308 can provide a current signal 315 to charge ramp node 310 and capacitor 320 through resistor 302 and switch 304, and the voltage of ramp node 310 can ramp up towards the voltage of power supply terminal 308. The amount of current 315 is based on the combined resistance of resistor 302 and switch 304. Also, switch 306 can provide a pull-down path, where if switch 306 is enabled, switch 306 can provide a current path to discharge ramp node 310 (and capacitor 320), to bring the voltage of ramp node 310 towards the voltage of ground terminal 312 (e.g., zero volts). Control circuit 307 can generate control signals 314 and 316 based on intermediate divided clock signal 210 and clock signal 104 to enable and disable the pull-up and pull-down paths at different times, to generate a ramp voltage signal 318 at ramp node 310. Buffer 322 can generate clock signal 104 from ramp voltage signal 318. For example, buffer 322 can switch the state of clock signal 104 based on the ramp voltage signal 318 exceeding or falling below a threshold (e.g., half of power supply voltage of buffer 322). The ramp rate of ramp voltage signal 318 can determine the time at which clock signal 104 switches state, which can set the phase difference (or time difference between edges) between intermediate divided clock signal 210 and clock signal 104.

Specifically, control circuit 307 can set both control signals 314 and 316 to a respective off state (e.g., representing a logical zero) to disable both switches 304 and 306. Responsive to detecting a rising edge of intermediate divided clock signal 210, control circuit 307 can set control signal 314 to an on state (e.g., representing a logical one) to enable switch 304 and the pull-up path, and ramp voltage signal 318 can start ramping up. Clock signal 104 can be de-asserted until ramp voltage signal 318 exceeds a threshold (e.g., half of power supply voltage of buffer 322), at which point clock signal 104 becomes asserted (i.e. a rising edge of clock signal 104 is produced). Also, responsive to detecting a rising edge of clock signal 104, control circuit 307 can set control signals 314 back to the off state to disable switch 304 and stop the ramping. Control circuit 307 can wait for a first duration after setting control signal 314 to the off state, and then set control signal 316 to an on state to enable switch 306, which enables the pull-down path to discharge ramp node 310 and capacitor 320. Control circuit 307 can maintain control signal 316 in the on state for a second duration to allow ramp node 310 and capacitor 320 to be fully discharged (or to be discharged by a certain threshold percentage), during which time clock signal 104 becomes de-asserted (i.e., a falling edge of clock signal 104 is produced). After the second duration has elapsed, control circuit 307 can set control signal 316 back to the off state, which ends the cycle of clock signal 104. Control circuit 307 can then monitor for the next rising edge of intermediate divided clock signal 210 to start a new cycle of clock signal 104. In some examples, buffer 322 can also transition clock signal 104 from the asserted state to the de-asserted state responsive to the ramp voltage signal 318 exceeding the threshold (e.g., during the charging of capacitor 320), and transition clock signal 104 from the de-asserted state to the asserted state responsive to the ramp voltage signal 318 falling below the threshold (e.g., as a result of the discharging of capacitor 320).

Also, the capacitance of capacitor 320 is programmable. Accordingly, the ramp slope of ramp voltage signal 318, and the phase difference (or time difference between edges) between intermediate divided clock signal 210 and clock signal 104, are also programmable, and DTC 204 generates clock signal 104 by adding a programmable delay to intermediate divided clock signal 210. DTC 204 allows programmability of the delay added to intermediate divided clock signal 210 based on the residual error signal value (Res).

In FIG. 3A, the programmability of the delay can be provided by programming the capacitance of capacitor 320 and/or the resistor 302 utilized for gain control of the DTC. In some examples, capacitor 320 can include a set of capacitors, each coupled to ramp node 310 by a respective switch 330, and the switch can connect the capacitor to or disconnect the capacitor from ramp node 310 based on the Res value represented by control signals 214. In some examples, each switch 330 can also be coupled between capacitor 320 and the ground (or power supply terminal 308). Control signals 214 can include binary and/or thermometer control bits. For example, capacitor 320 can include a set of capacitors 320a, 320b, . . . 320N and a set of switches 330a, 330b, . . . 330N. Control signals 214 can include control signals bits 214a, 214b, . . . 214N, where control signal bit 214a connects/disconnects capacitor 320a, control signal bit 214b connects/disconnects capacitor 320b, and control signal bit 214N connects/disconnects capacitor 320N. In some examples, the capacitors can be binary segmented. In some examples, some of the capacitors can be binary segmented, and some of the capacitors can be thermometer segmented. Each segmented capacitor (or a group of segmented capacitors) can be mapped to a particular binary/thermometer bit of control signals 214. In some examples, a higher Res value can indicate a longer delay to be added, and capacitor 320 can be programmed to provide an increased capacitance to ramp node 310 such that the ramp slope is decreased, while a lower Res value can indicate a shorter delay to be added, and capacitor 320 can be programmed to provide a reduced capacitance to ramp node 310 such that the ramp slope is increased. In some examples, a capacitor can be connected to ramp node 310 if the mapped bit is asserted, and disconnected from ramp node 310 if the mapped bit is deasserted. Also, in examples where capacitor 320 includes a set of binary and thermometer segmented capacitors, DTC 204 can include a binary-to-thermometer code converter (not shown in FIG. 3C) to convert some of the most significant bits (MSBs) and/or some of the least significant bits (LSBs), of the Res value to thermometer codes, which sets the switch on/off states of a set of thermometer segmented capacitors.

FIG. 3B illustrates another example of DTC 204. FIG. 3B is an example of a current mode DTC 204. Referring to FIG. 3B, DTC 204 includes a variable current source 340 coupled between power supply terminal 308 and switch 304. In some examples, variable current source 340 can include a set of binary/thermometer segmented current sources 340a, 340b, . . . 340N. Each current source can be enabled/disabled (or otherwise connected to or disconnected from ramp node 310) based on the Res value represented by control signals 214 to set an amount of current 315. The capacitance of capacitor 320 can be fixed or otherwise not programmable with respect to the Res values. Accordingly, the ramp slope of intermediate clock signal 314 is programmed based on current 315.

In some examples, control signals 214 can include control signals bits 214a, 214b, ... 214N, where control signals bit 214a enables/disables current source 340a, control signals bit 214b enables/disables current source 302b, and control signals bit 214N enables/disables current source 302N. In some examples, a higher Res value can indicate a longer delay to be added, and the current source can provide a reduced current to charge capacitor 320 (and ramp node 310), while a lower Res value can indicate a shorter delay to be added, and the current source can provide an increased current to charge capacitor 320 (and ramp node 310). In some examples, some of the current sources 340 can be binary segmented. In some examples, some of the current sources can be binary segmented and some of the current sources can be thermometer segmented. Each segmented current source (or a group of segmented current sources) can be mapped to a particular binary/thermometer bit of control signals 214, and the current source can be enabled if the mapped binary bit is deasserted (a logical zero) and enabled if the mapped binary bit is asserted (a logical one). In examples where the current sources 340 include thermometer segmented current sources, DTC 204 can include a binary-to-thermometer code converter (not shown in FIG. 3B) to convert some of the most significant bits (MSBs) and/or some of the least significant bits (LSBs) of the Res value to thermometer codes, which sets the switch on/off states of a set thermometer segmented current sources.

Figure 4:
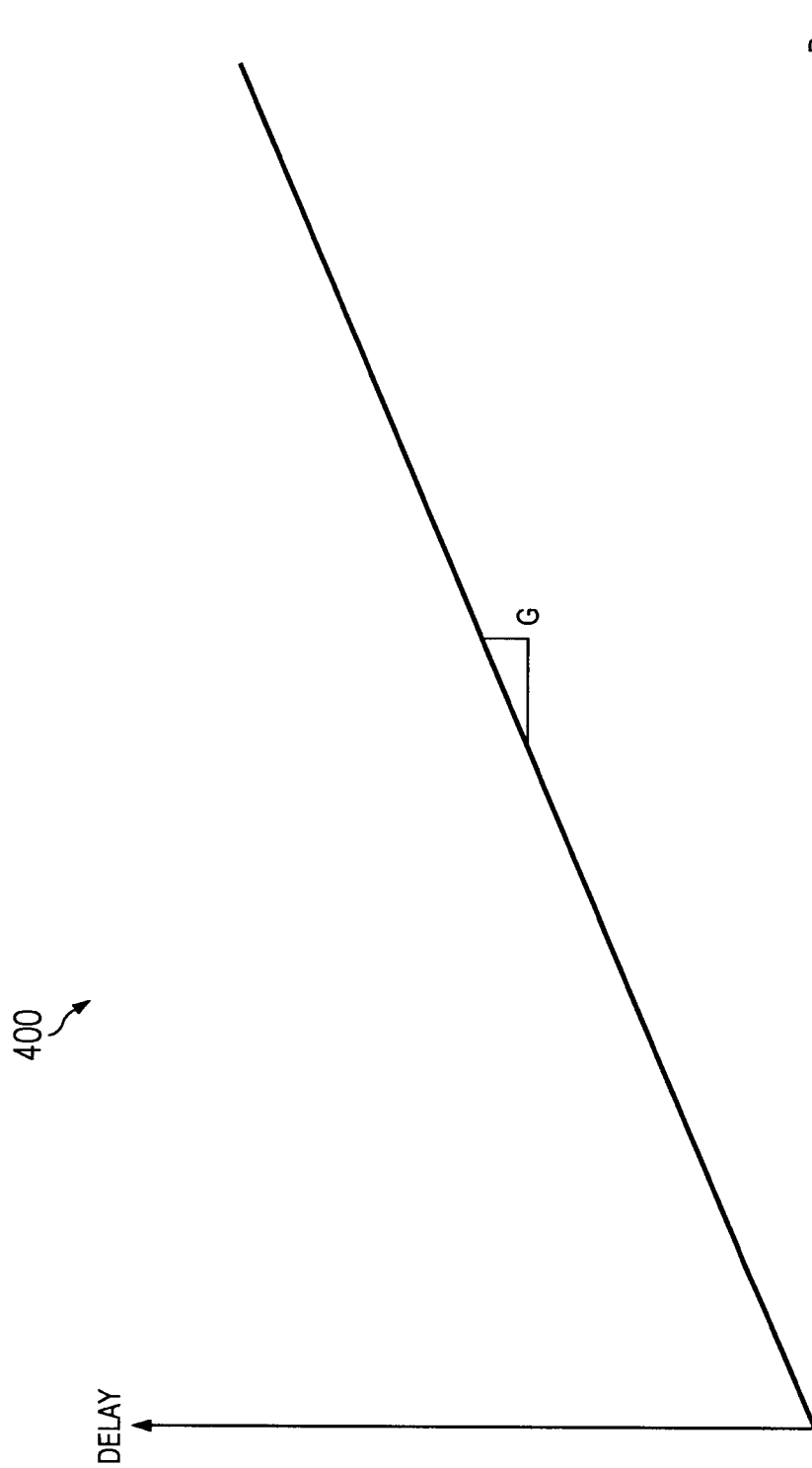
FIG. 4 includes a graph that illustrates a transfer characteristic of a DTC, in accordance with various examples.

In some examples, DTC 204 has a linear transfer characteristic, in which DTC 204 sets the delay according to a linear relationship with the Res value. FIG. 4 illustrates a graph 400 that illustrates an example transfer characteristic of DTC 204. Referring to graph 400, the slope between delay values and the Res value can be represented by a gain (G) value. The gain value can also define a conversion ratio between the delay values and the Res values. For a linear relationship, the gain value is a constant across the Res and delay values. The gain value can be based on, for example, the RC product of resistor 302 and capacitor 320 for the RC mode DTC or by the current/capacitance ratio of current source 340 and capacitor 320 for the current mode DTC.

Various non-idealities of DTC 204 can lead to deviation from the example linear transfer characteristic shown in FIG. 4. Because of the deviation from the linear transfer characteristic, DTC 204 can introduce instantaneous timing errors to clock signal 104, which can lead to jitter and unwanted spurious contents in clock signal 104.

Figure 5:
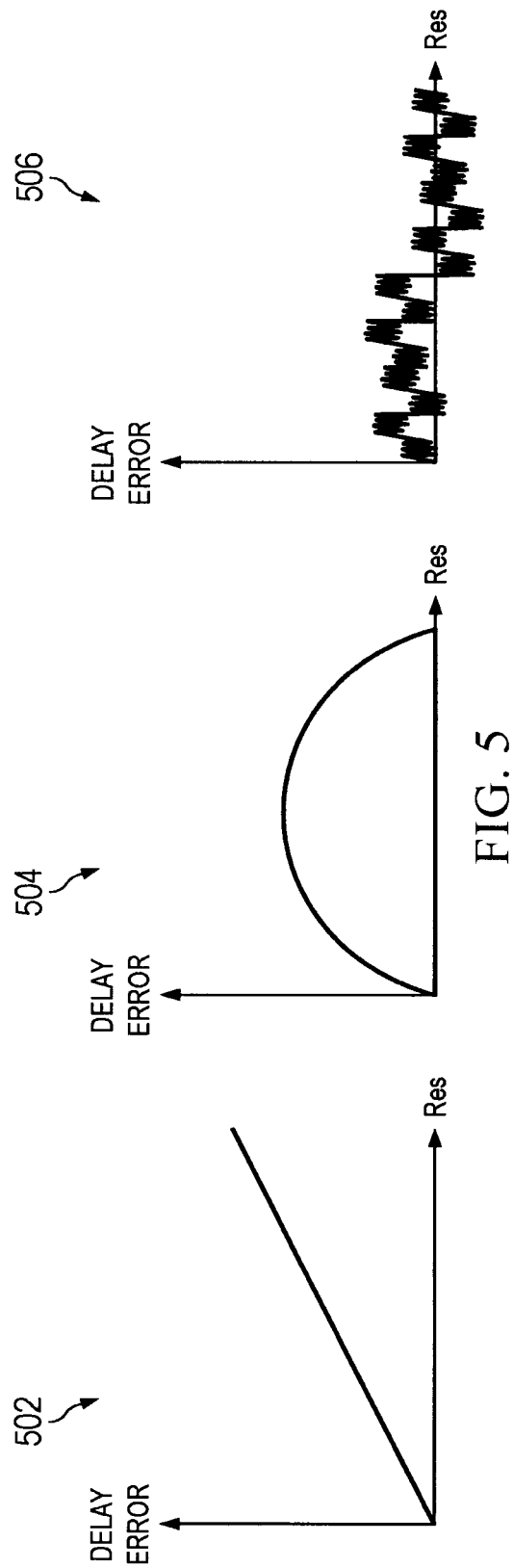
FIG. 5 include graphs that illustrate deviations from the transfer characteristic of a DTC, in accordance with various examples.

FIG. 5 includes graphs 502, 504, and 506 of deviations from a linear transfer characteristic, in accordance with various examples. Graph 502 illustrates an example of a gain error, in which the gain provided by DTC 204 in converting Res values to delay deviates from a nominal gain (such as the gain value shown in FIG. 4), which results in a gain error (and a delay error). Moreover, the gain error (and the resulting delay error) increases with the Res values. One example source of the gain error is due to change in the RC time constant provided by the resistance of the pull-up path (resistor 302 and switch 304) and capacitor 320 due to process, voltage, and temperature variations.

Also, graph 504 illustrates an example of a non-linearity error, such as an integrated non-linearity (INL) error. The INL error can be obtained by measuring a deviation of delay provided by DTC 204 with respect to Res value from a target linear transfer characteristic (e.g., as shown in graph 400) with gain error removed, so that the delay error due to INL is zero at the minimum and maximum Res values. The INL errors shown in graph 504 can be parametric INL errors. One example source of INL errors can come from buffer 322, which can introduce different delays between intermediate clock signal 314 and clock signal 104 responsive to the different ramp slopes of intermediate clock signal 314 (for different capacitor values) and due to process, voltage, and temperature variations. The INL shown in graph 504 can have a quadratic relationship with the Res values, and the maximum delay error (represented by the peak INL error) can vary with process, voltage, and temperature.

Further, graph 506 illustrates an example of mismatch error. The mismatch error can be due to mismatches between, for example, capacitors 320 of FIG. 3A and current sources 340 of FIG. 3B. As described above, some of the capacitors 320 and current sources 340 can be binary segmented and/or thermometer segmented, and each segmented capacitor/current source can each be mapped to a particular binary/thermometer bit of control signals 214 representing the Res value. Each segmented capacitor can include a set of unit capacitors, and each segmented current source can include a set of unit current sources. The segmentation/scaling can be based on mapping different number of unit capacitors/unit current sources to different binary bits. For example, referring again to FIGS. 3A and 3B, the size of current source 340a can be twice of current source 340b (e.g., having twice of unit current sources) so that current source 340a provides twice of the current of current source 340b. Also, the size of capacitor 320a can be twice of the size of capacitor 320b (e.g., having twice of unit capacitors). But due to random device mismatches (e.g., between unit current sources or unit capacitors), current source 340b does not provide exactly twice of the current of current source 340a, and capacitor 320b does not have exactly twice of capacitance of capacitor 320a. Such random device mismatches can introduce mismatch errors, and the resulting delay errors can also appear as mismatch errors as shown in graph 506. In some examples, the INL errors of DTC 204 can include mismatch errors (example shown in graph 506) superimposed on the parametric INL errors (example shown in graph 504).

Figure 6A:
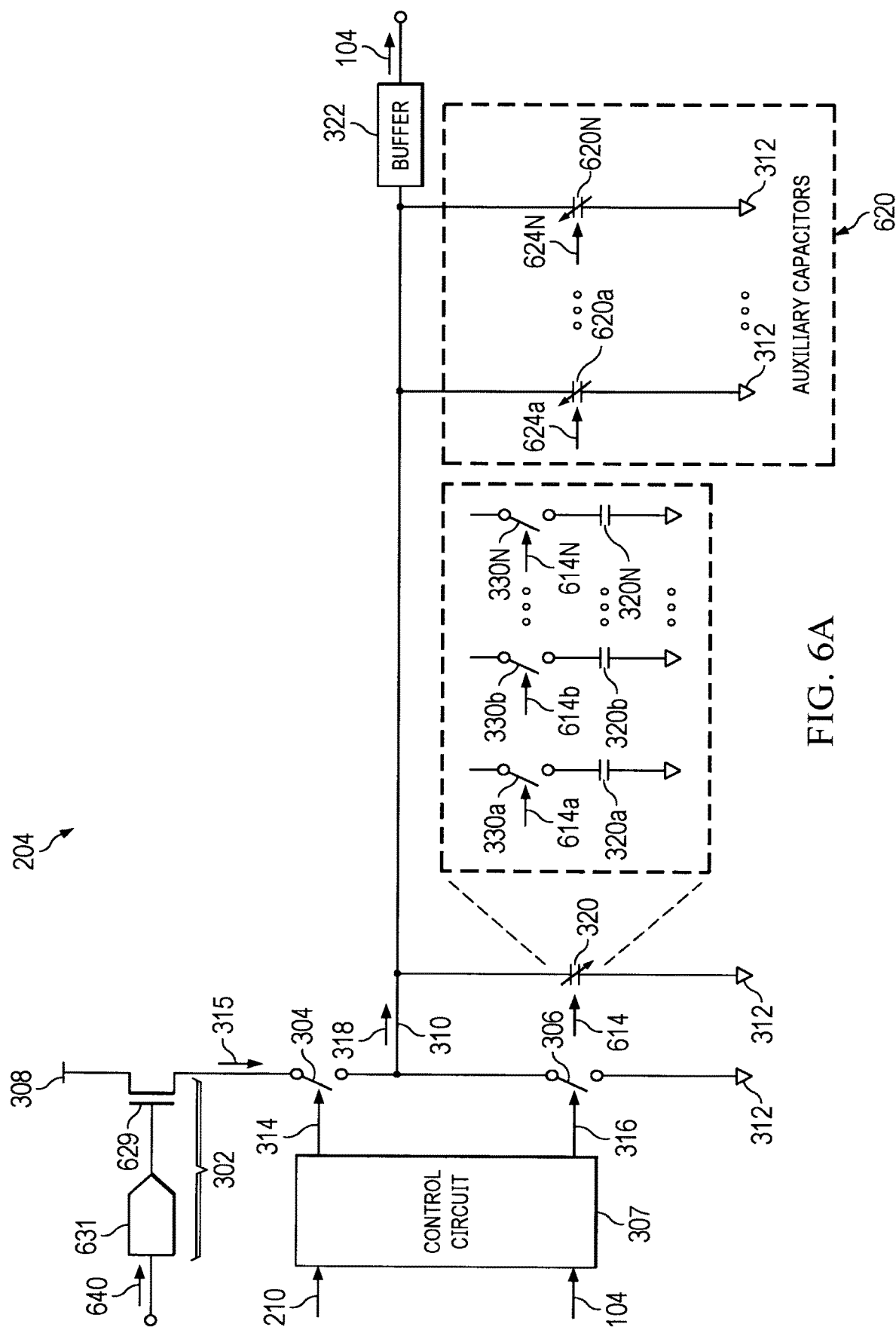

FIGS. 6A, 6B, 6C, and 6D illustrate examples of DTC 204 including components to support calibration operations to mitigate the gain errors, INL errors, and mismatch errors. FIG. 6A illustrates an example of an RC mode DTC 204 including main capacitor 320 to set the ramp slope of ramp signal 318, which sets the delay of clock signal 104 with respect to intermediate divided clock signal 210. Capacitor 320 can be a main capacitor to provide a set of main delay elements, in which capacitors 320a-N can include a set of binary-weighted capacitors to set the nominal delay of clock signal 104, and switches 330a-N can be controlled by a control signals 614 representing a main code that corresponds to the Res value. Control signals 614 can include binary and/or thermometer bits, with bit 614a to connect/disconnect capacitor 320a to/from ramp node 310, and bit 614N to connect/disconnect capacitor 320N to/from ramp node 310. In some examples, control signals 614 can represent compensated Res values, generated from the Res values represented by signal 214, that compensates for (or mitigates) INL errors of DTC 204 error (e.g., caused by ramp slope dependent delay of buffer 322). DTC 204 has a DTC control input coupled to capacitor 320 to receive control signals 614, and provide control signals 614 to program capacitor 320.

Also, in the example of FIG. 6A, DTC 204 can include a set of auxiliary capacitors 620a-620N to provide a set of auxiliary delay elements. Each of the auxiliary capacitors 620a-620N can be coupled to a respective one of control signals 624a-624N. Each auxiliary capacitor can have variable capacitance, and can include binary segmented capacitors, thermometer segmented capacitors, or both, and switches controllable to disconnect each binary/thermometer segmented capacitor from ramp node 310 and/or ground/power supply terminal 308, similar to the configuration of capacitor 320 illustrated in FIG. 6A. Each segmented capacitor can be mapped to a particular binary/thermometer bit of the respective control signals 614. Each segmented auxiliary capacitor can include a set of unit capacitors, and the number of the unit capacitors included in the segmented auxiliary capacitor can reflect the binary/thermometer bit of control signals 614 mapped to the segmented auxiliary capacitor. DTC 204 has a DTC calibration input coupled to auxiliary capacitors 620 to receive control signals 614, and provide control signals 614 to program auxiliary capacitors 620.

Each auxiliary capacitor 620a-620N can be mapped to and combine with a particular main capacitor 320, or a set of main capacitors 320, to adjust the delay of clock signal 104 in order to mitigate the mismatch error (e.g., caused by mismatch between main capacitors). For example, auxiliary capacitor 620a can be mapped to and combine with main capacitor 320a, and auxiliary capacitor 620N can be mapped to and combine with main capacitor 320N. Accordingly, control signals 624a can represent a correction code to set the capacitance of auxiliary capacitor 620a, and auxiliary capacitor 620a combines with main capacitor 320a to set the delay of clock signal 104 when main capacitor 320a is selected by control signals 614a to connect to ramp node 310. Also, control signals 624N can represent a correction code to set the capacitance of auxiliary capacitor 620N, and auxiliary capacitor 620N combines with main capacitor 320N to set the delay of clock signal 104 when main capacitor 320N is selected by control signals 614N to connect to ramp node 310. Each correction code can adjust the total capacitance of a particular set of main and auxiliary capacitors to mitigate the random mismatch error between main capacitors. In some examples, each auxiliary capacitor includes a smaller number of unit capacitors and switches controlled by 624 that allow selective connection of the unit capacitors to ramp signal 310.

Figure 6B:
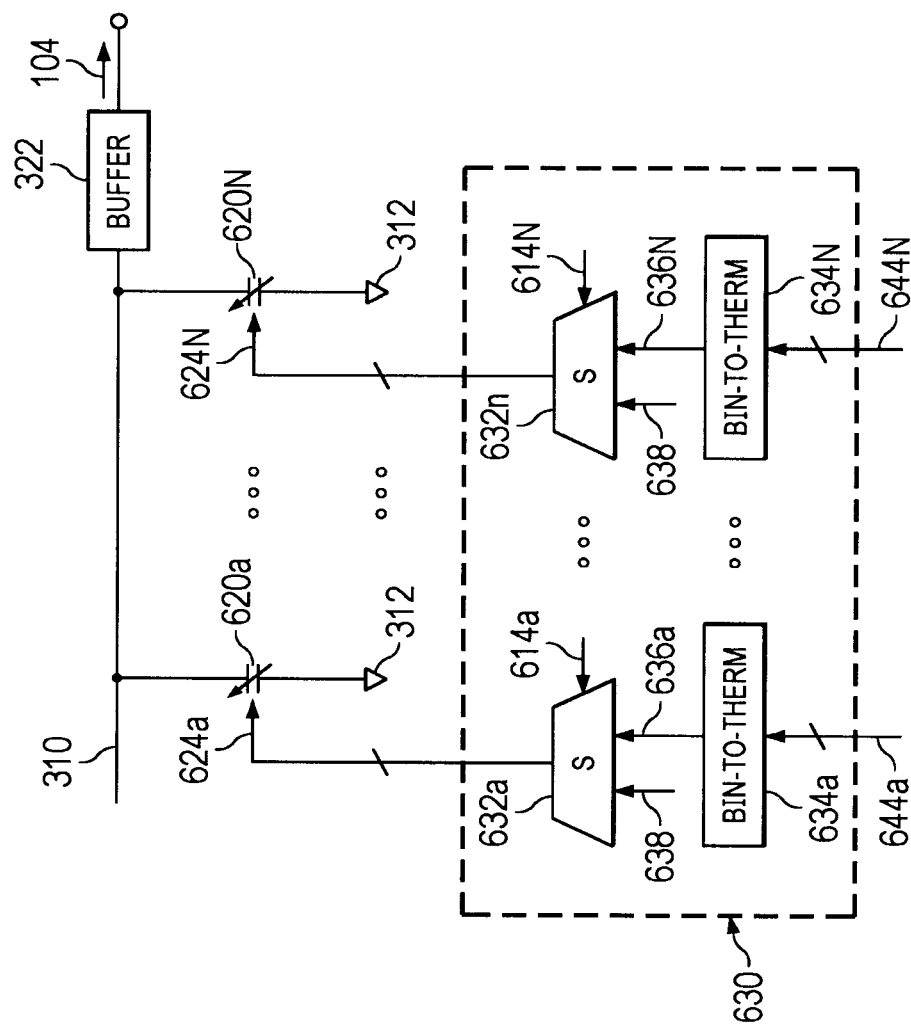

FIG. 6B illustrates examples of an auxiliary delay element control circuit 630 to control a set of thermometer segmented auxiliary capacitors 620 of FIG. 6A In the example of FIG. 6B, auxiliary delay element control circuit 630 can be part of DTC 204. In some other examples, as to be described below, auxiliary delay element control circuit 630 can be external to DTC 204. Auxiliary delay element control circuit 630 can include a set of multiplexors 632 and a set of binary-to-thermometer code converters 634 to generate control signals 624 based on a set of mismatch error signals 644. As to be described below, clock divider 102 can include a calibration circuit to measure random mismatch errors between segmented capacitor/current sources and generate a mismatch error signal 644 for a particular segmented capacitor/current source, such as mismatch error signal 644a for main capacitor 320a, and mismatch error signal 644N for main capacitor 320N. Auxiliary delay element control circuit 630 can convert the mismatch error signal 644a to control signals 624a for the auxiliary capacitor 620a mapped to main capacitor 320a, and convert the mismatch error signal 644N to control signals 624N for the auxiliary capacitor 620N mapped to main capacitor 320N. Mismatch error signals 644 can be in the form of binary codes.

Binary-to-thermometer code converter 634 can converter the binary codes of a mismatch error signal 644 (e.g., 644a and 644N) to thermometer codes 636 (e.g., 636a and 636N). Also, each multiplexor 632 (e.g., 632a and 632N) can select between a respective thermometer code 636 or a default code 638 based on control signals 614, and provide the selected code as control signals 624 (e.g., 624a, 624N) to selectively connect (or disconnect) each capacitor in a set of auxiliary capacitors 620 (e.g., each capacitor of auxiliary capacitors 620a, each capacitor of auxiliary capacitors 620N) to ramp node 310.

Specifically, the bit value represented by a control signals 614 can indicate whether a particular segmented main capacitor 320 is to be connected to or disconnected from ramp node 310. If the bit value indicates that the main capacitor 320 is to be selected, multiplexor 632 can forward the thermometer code 636 to set the capacitance of auxiliary capacitor 620 to mitigate random mismatch error of that main capacitor 320. But if the bit value indicates that the main capacitor 320 is not to be selected, multiplexor 632 can forward the default code 638 to set the capacitance of auxiliary capacitor 620. In some examples, the default code can correspond to a middle value to enable half of the capacitors in the set of auxiliary capacitors. Such arrangements allow positive/negative tuning of the combined main and auxiliary capacitances as influenced by the main code binary bits. In some examples, default code can also be zero.

For example, if control signals 614a indicates that main capacitor 320a is to be selected, multiplexor 632a can forward thermometer code 636a to auxiliary capacitor 620a to set its capacitance and to combine some or all of the unit capacitors of auxiliary capacitor 620a with main capacitor 320a to mitigate the random mismatch error at main capacitor 320a. On the other hand, if control signals 614a indicates that main capacitor 320a is not to be selected, multiplexor 632a can forward default code 638 to auxiliary capacitor 620a and connect some (e.g., half) of the unit capacitors of auxiliary capacitor 620a to ramp node 310. In the case where default code is zero, auxiliary capacitor 620a can be completely disconnected from ramp node 310. Also, if control signals 614N indicates that main capacitor 320N is to be selected, multiplexor 632N can forward thermometer code 636N to auxiliary capacitor 620N to set its capacitance and to combine some or all of the unit capacitors of auxiliary capacitor 620N with main capacitor 320N to mitigate the random mismatch error at main capacitor 320N. On the other hand, if control signals 614N indicates that main capacitor 320N is not to be selected, multiplexor 632N can forward default code 638 to auxiliary capacitor 620N to connect some (e.g., half) of the unit capacitors of auxiliary capacitor 620a to ramp node 310, or completely disconnect auxiliary capacitor 620N from ramp node 310.

FIG. 6C illustrates another example of auxiliary delay element control circuit 630. Referring to FIG. 6C, auxiliary delay element control circuit 630 may include multiplexors 632 (e.g., 632a, 632b, 632N), an adder 652, and binary-to-thermometer code converter 634. Each multiplexor 632 can selectively forward one of default code 638 or a respective mismatch error signal 644 (e.g., 644a, 644b, and 644N) as a respective forward signal 654 (e.g., 654a, 654b, and 654N) based on the respective control signals 614 (e.g., 614a, 614b, and 614N). Accordingly, each forward signal 654 can represent either the default code or a mismatch error signal 644 for a particular auxiliary capacitor 620 depending on whether the main capacitor 320 mapped to that auxiliary capacitor 620 is selected by a particular main code represented by control signals 614. Adder 652 can add the forward signals 654 to generate a summation signal 656, which can represent a binary code. Binary-to-thermometer code converter 634 can convert the binary code represented in summation signal 656 into control signals 624 to selectively connect/disconnect the auxiliary capacitors 620 to ramp node 310 for a particular main code represented by control signals 614.

Referring again to FIG. 6A, DTC 204 can include a transistor 629 having a gate terminal, and a digital-to-analog converter (DAC) 631 coupled to the gate terminal. Transistor 629 can provide the resistance of resistor 302 of FIG. 3A, and the resistance can be adjusted by the gate voltage provided by DAC 631. In some examples, connections to power supply terminal 308 and ground terminal 312 are interchanged such that transistor 629 is coupled to ground terminal 312, switch 306 is coupled to power supply terminal 308, etc. For simplicity, all discussions will assume coupling to power supply terminal 308 and ground terminal 312 as shown in FIG. 3A with the understanding that such coupling can be interchanged. In some examples, DTC 204 may include resistors (not shown in FIG. 6A), which can be programmable/trimmable, coupled in series with or in parallel with transistor 629. The resistors can combine with transistor 629 to set the overall resistance between power supply terminal 308 and switch 304, so that overall resistance can be adjusted by the programmable/trimmable resistors in addition to by DAC 631. DAC 631 can receive control signals 640 representing a gain code, and convert the gain code to a gate voltage of transistor 629. The gate voltage can set the amount of resistance corresponding to resistor 302 of FIG. 3A, which can be used to adjust the gain of DTC 204 in converting the Res value to the delay of clock signal 104. In a case of gain error where DTC 204 has an incorrect slope between delay values and the Res value, DAC 631 is used to adjust the resistance that transistor 629 provides corresponding to the resistor 302 of FIG. 3A such that the desired slope between delay values and the Res value is achieved. DTC 204 has a calibration input to receive control signals 640 and provide control signals 640 to DAC 631.

Figure 6D:
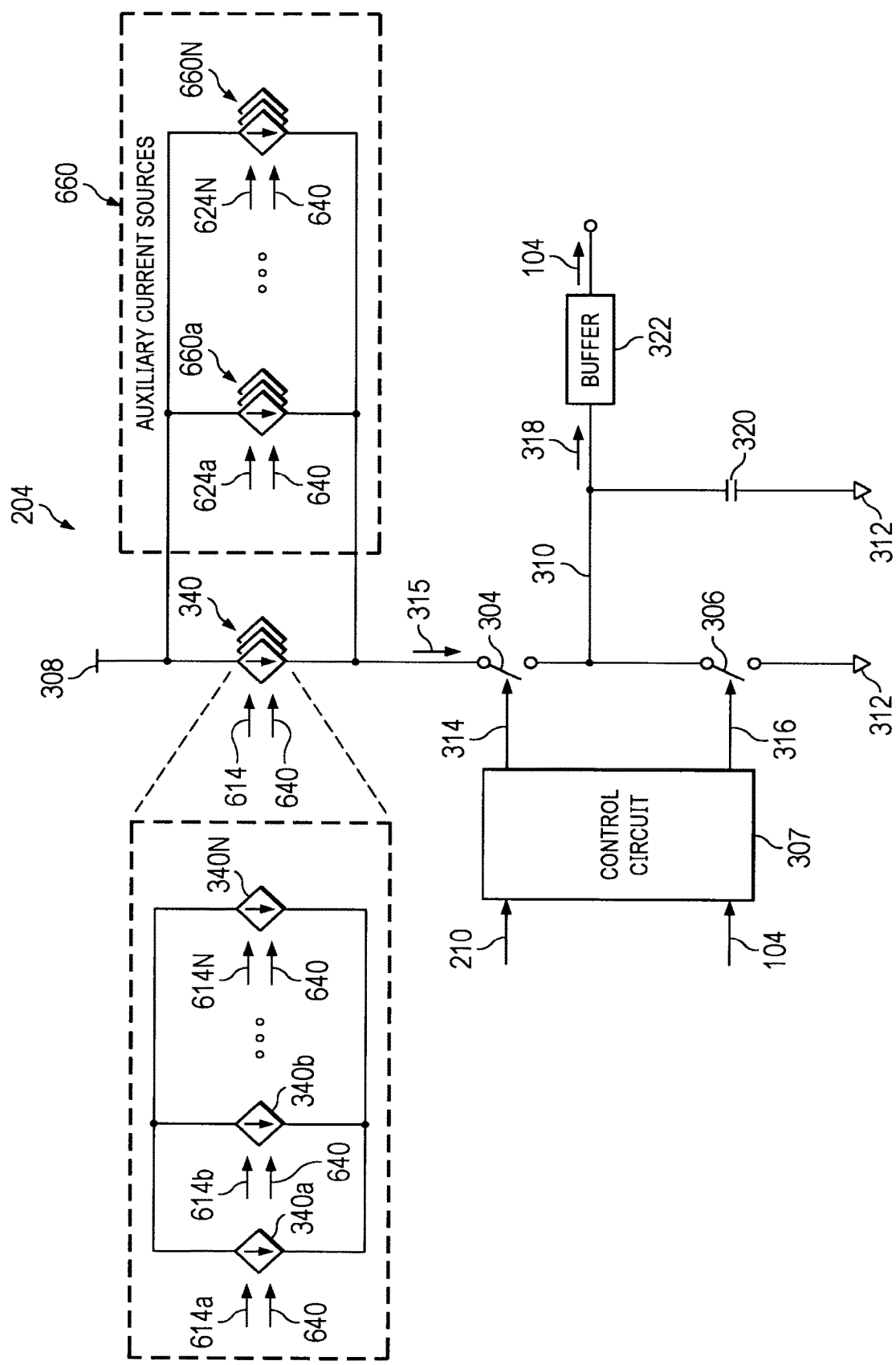

FIG. 6D illustrates another example of a current mode DTC 204 including main current sources 340a-N and auxiliary current sources 660a-660N to set the ramp slope of intermediate clock signal 314. In the example of FIG. 6D, DTC 204 includes main current source 340 and auxiliary current sources 660a-660N coupled between power supply terminal 308 and switch 304. Main current source 340 can include a set of binary and/or thermometer segmented current sources and can provide a set of main delay elements, and each main current source can be enabled/disabled by a respective bit of control signals 614 representing the main code. For example, current source 340a can enabled/disabled based on the state of binary bit 614a, and current source 340N can be enabled/disabled based on the state of binary bit 614N. Also, each of main current sources 340a-340N can receive control signals 640 representing the gain code to set the amount of current provided by main current sources when enabled.

Also, in FIG. 6D, DTC 204 can include a set of auxiliary current sources 660a-660N coupled between power supply terminal 308 and switch 304. In some examples, each of auxiliary current sources 660a-660N can include a set of binary/thermometer segmented current sources, where each segmented current source can be enabled/disabled (or otherwise connected to or disconnected from ramp node 310) based on a respective control signal 624 (e.g., control signal 624a for auxiliary current source 660a, control signal 624N for auxiliary current source 660N, etc.) to set a current provided by the auxiliary current source. Auxiliary current sources 660a-660N can provide a set of auxiliary delay elements. Each auxiliary current source can correspond to a particular bit of control signals 614, and can combine with a main segmented current source 340 to adjust the delay of clock signal 104, to mitigate the mismatch error (e.g., caused by mismatch between main current sources). For example, auxiliary current source 660a can combine with main current source 340a if current source 340a is selected, auxiliary current source 660N can combine with main current source 340N if current source 340N is selected. In some examples, each auxiliary current source 660 (e.g., each of 660a and 660N) can have a set of unit current sources grouped into segmented auxiliary current sources, and one or more of the segmented auxiliary current sources can be enabled/disabled (or connected to/disconnected from ramp node 310) based on the respective control signals 624 (e.g., control signals 624a for auxiliary current source 660a, control signals 624N for auxiliary current source 660N). DTC 204 of FIG. 6D can also include auxiliary delay element control circuit 630 of FIGS. 6B and 6C to generate control signals 624 based on mismatch error signals 644 and control signals 614 representing the main code, as described above. As described above, DTC 204 has a control input to receive control signals 614, and calibration inputs to receive control signals 640 and 644.

In some examples, an electronic device (e.g., electronic device 100) can include a calibration circuit to perform calibration of DTC 204 to reduce/mitigate the gain error, INL error, and mismatch error. The calibration circuit can be part of or external to clock divider 102. In some examples, the calibration circuit can perform an off-line calibration operation, in which the calibration is performed when clock divider 102 is off-line. Referring again to FIG. 1, clock divider 102 can be off-line when, for example, clock divider 102 does not provide clock signal 104 to component 108, component 108 does not use clock signal 104, and/or component 108 is in a disabled state. As part of the off-line calibration operation, the calibration circuit can sweep through each Res value, determine the delay errors, and perform the gain error, INL error, and mismatch error calibration on DTC 204 to reduce/mitigate those errors.

In some examples, the calibration circuit can also perform an on-line calibration operation, in which the calibration is performed when clock divider 102 is on-line and provide a functional clock signal 104, and component 108 can use clock signal 104. The on-line calibration operation involves correlation operations between an instantaneous Res value and an instantaneous delay error. Compared with the off-line calibration where clock divider 102 is taken off-line to receive a set of Res values, the on-line calibration operation can mitigate the disruption to the generation of clock signal 104 (and to the function of component 108 and electronic device 100). Such arrangements also allow the calibration operation to be performed continuously while clock divider 102 (and component 108) is functional. This allows the calibration circuit to dynamically track and mitigate/eliminate the gain error, INL error, and mismatch error contributed as the operation condition (e.g., temperature and voltage) of electronic device 100 change. All these can reduce the delay errors introduced by DTC 204 and the resulting jitter and spurious contents in clock signal 104.

Figure 7:
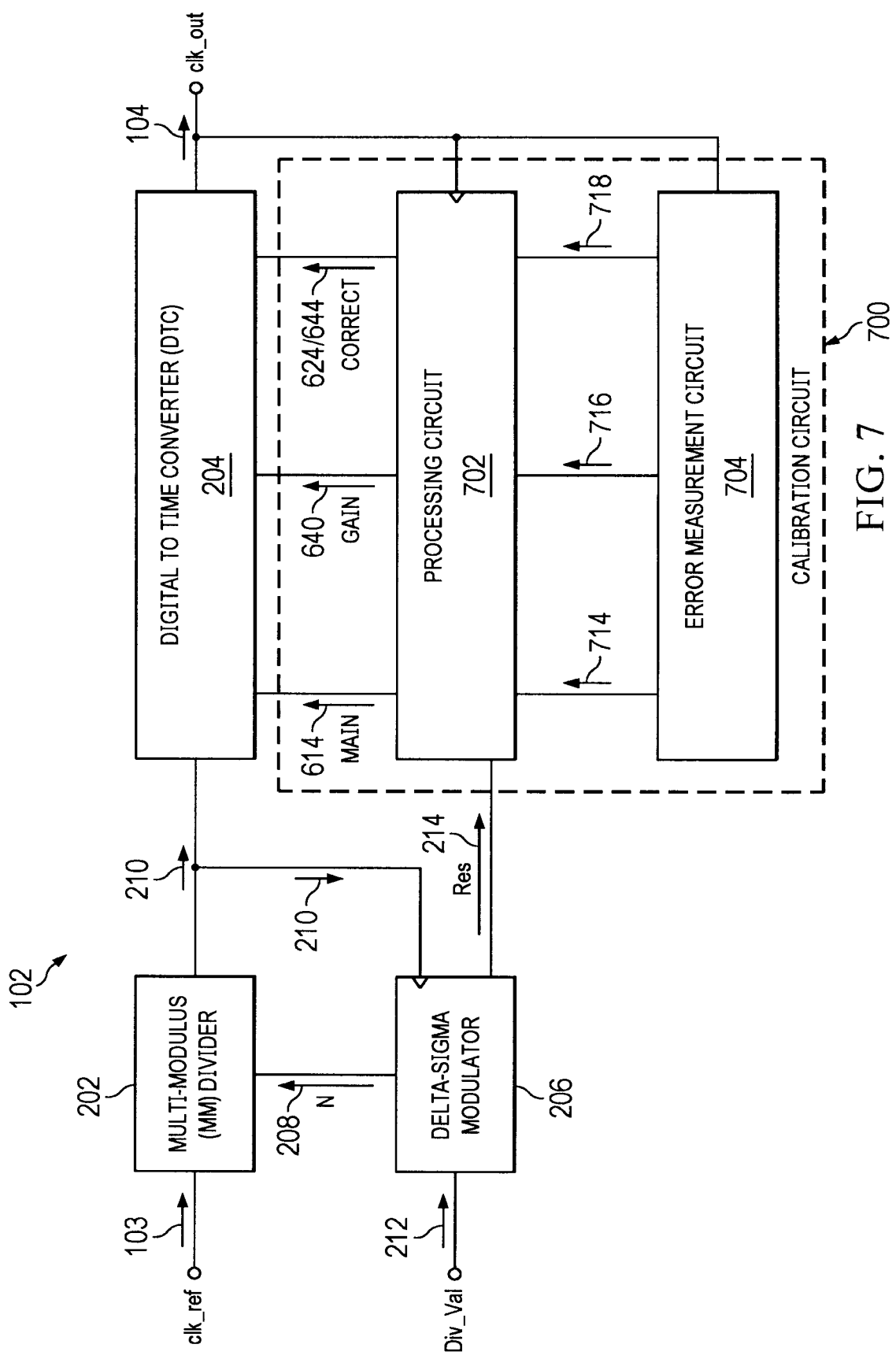
FIG. 7 is a schematic of an electronic device including a clock divider, a calibration circuit, and a processing circuit in accordance with various examples.

FIG. 7 illustrates an example of clock divider 102 including components to mitigate delay error of DTC 204 caused by the aforementioned non-idealities. Referring to FIG. 7, clock divider 102 includes a calibration circuit 700 in addition to MM divider 202, the DTC 204, and delta-sigma modulator 206. DTC 204 can include DAC 631 and auxiliary capacitors 620 (of FIG. 6A) and/or auxiliary current sources 660 (of FIG. 6D). Also, calibration circuit 700 includes processing circuit 702 and error measurement circuit 704. Processing circuit 702 can include an input coupled to a second output of delta-sigma modulator 206 to receive control signals 214 representing the Res value. For a particular Res value, processing circuit 702 can generate control signals 614 representing a main code, control signals 644 (or 624) representing a correction code, and control signals 640 representing a gain code, and provide control signals 614, 644 (or 624), and 640 to DTC 204. In some examples, processing circuit 702 can include auxiliary delay element control circuit 630 to generate control signals 624 from control signals 644, and processing circuit 702 can provide control signals 624 to DTC 204. In some examples, processing circuit 702 can have a clock input coupled to the output of DTC 204, and the operations of processing circuit 702 (e.g., generation of the control signals) can be synchronized to clock signal 104. In some examples (not shown in FIG. 7), the clock input of processing circuit 702 can also be coupled to the output of MM divider 202, and the operations of processing circuit 702 can be synchronized to intermediate divided clock signal 210.

Also, calibration circuit 700 may include error measurement circuit 704 to perform the aforementioned off-line and on-line calibration operations. Error measurement circuit 704 can include an input coupled to the output of DTC 204 to receive clock signal 104, measure the delay error of DTC 204 from clock signal 104, and generate error signals 714, 716, and 718. Error signal 714 can be utilized for gain error correction, error signal 716 can be utilized for INL error correction, and error signal 718 can be utilized for mismatch error correction. Error measurement circuit 704 can provide error signals 714, 716, and 718 to processing circuit 702, which can correlate the error signals 714, 716, and 718 with the Res value to generate control signals 614, 644 (or 624), and 640. In some examples, the input of error measurement circuit 704 can also be coupled to the input of DTC 204 to receive intermediate divided clock signal 210, and the operations of error measurement circuit 704 can be synchronized to intermediate divided clock signal 210.

Figure 8:
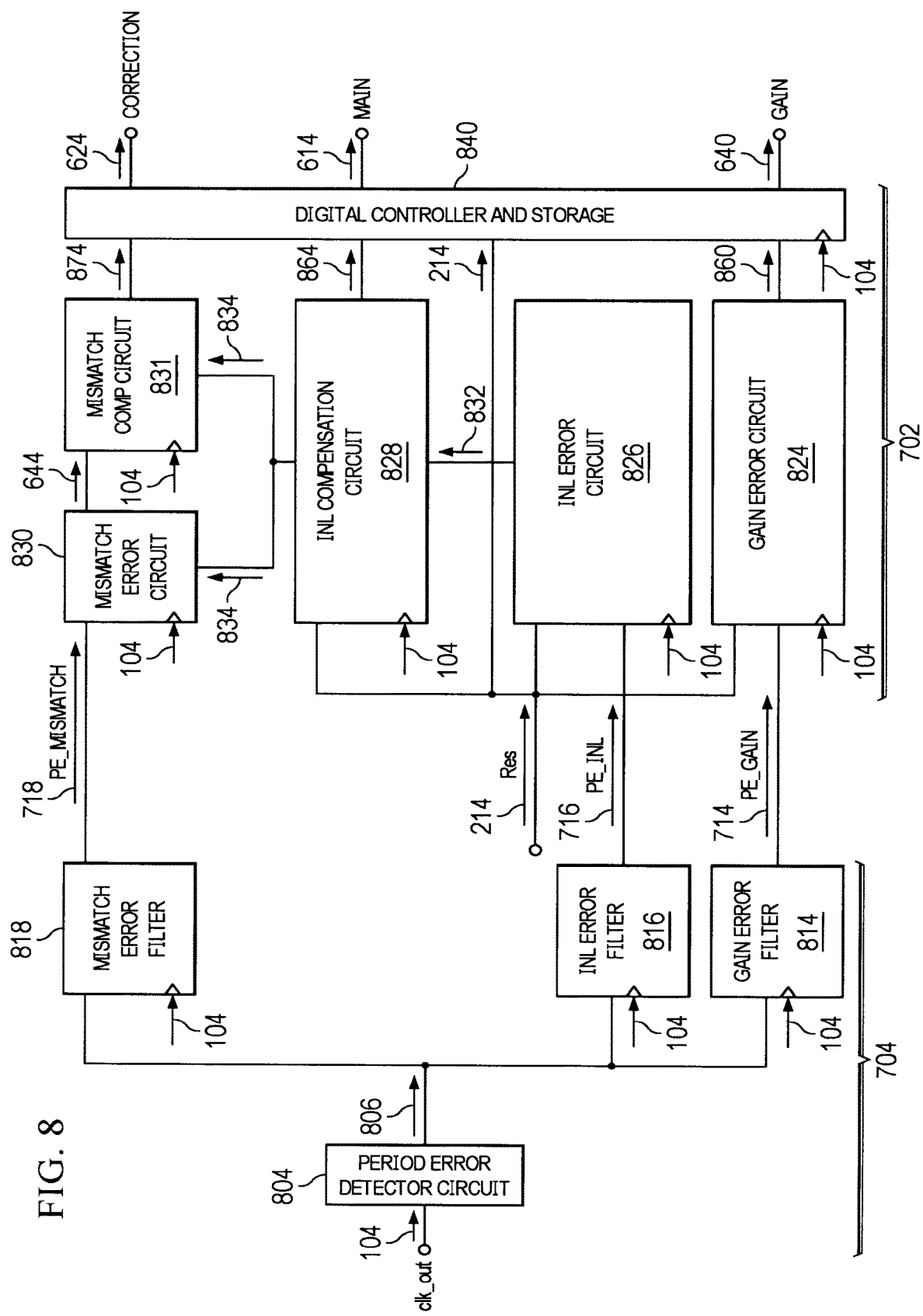
FIG. 8 is a schematic of internal components of the calibration circuit and the processing circuit of FIG. 7, in accordance with various examples.

FIG. 8 is a schematic illustrating example internal components of error measurement circuit 704 and processing circuit 702. Referring to FIG. 8, error measurement circuit 704 includes a period error detector circuit 804, a gain error filter 814, an INL error filter 816, and a mismatch error filter 818. Also, processing circuit 702 includes a gain error circuit 824, an INL error circuit 826, an INL compensation circuit 828, a mismatch error circuit 830, and a mismatch compensation circuit 831. The internal components of error measurement circuit 704 and processing circuit 702 have clock inputs to receive clock signal 104 so as to synchronize their operations to clock signal 104. In some examples error measurement circuit 704 and processing circuit 702 may utilize intermediate divided clock signal 210 for clock synchronization. In some examples, period error detector circuit 804 can be external to error measurement circuit 704. Various components of error measurement circuit 704 and processing circuit 702 can be implemented on an application specific integrated circuit (ASIC), a programmable logic device (e.g., field programmable gate array (FPGA)), or any other customized circuit blocks. In some examples, a processor (e.g., a microcontroller) can execute instructions to implement various functions of error measurement circuit 704 and processing circuit 702.

Period error detector circuit 804 has a first input coupled to the output of DTC 204 and an output. Period error detector circuit 804 can receive clock signal 104 from DTC 204 and detect cycle period errors in clock signal 104. A cycle period error can represent a deviation of a particular cycle period of clock signal 104 from a target cycle period. The target cycle period can correspond to a previous cycle period of clock signal 104. As to be described below, period error detector circuit 804 includes a tunable delay circuit and a time measurement circuit, and can detect and measure a cycle period error by measuring a time difference between an edge of clock signal 104 and an edge of a delayed version of clock signal 104. Such arrangements can reduce the complexity of circuits involved in the cycle period error measurements and calibration signal generations relative to more complex circuits such as phase locked loops, and can also reduce power consumption. Period error detector circuit 804 can provide an error signal 806 representing a measurement result of the cycle period error.

Each of gain error filter 814, INL error filter 816, and mismatch error filter 818 can receive error signal 806. Gain error filter 814 can generate error signal 714 (also labeled PE_GAIN) based on performing a filter operation on error signal 806, and provide error signal 714 to gain error circuit 824 of processing circuit 702. PE_GAIN can represent an error signal conditioned (e.g., through filtering) to extract the gain error component of the cycle period error. Also, INL error filter 816 can generate error signal 716 (also labelled PE_INL) based on performing a filter operation on error signal 806, and provide error signal 716 to INL error circuit 826 of processing circuit 702. PE_INL can represent an error signal best conditioned (through filtering) to extract the INL component of the cycle period error. Further, mismatch error filter 818 can generate error signal 718 (also labelled PE_MISMATCH) based on performing a filter operation on error signal 806, and provide error signal 718 to mismatch error circuit 830 of processing circuit 702. PE_MISMATCH can represent an error signal best conditioned (through filtering) to extract the mismatch component of the cycle period error. Each of gain error filter 814, INL error filter 816, and mismatch error filter 818 can include one or more stages of first difference filter (e.g., $1-z^{-1}$). In some examples, one or more of gain error filter 814, INL error filter 816, and mismatch error filter 818 can be omitted, and period error detector circuit 804 can forward error signal 806 to gain error circuit 824, INL error circuit 826, and/or mismatch error circuit 830.

Each of gain error circuit 824, INL error circuit 826, and INL compensation circuit 828 also receives control signals 214 representing Res values. In some examples, gain error circuit 824 can perform a correlation operation between Res (represented by control signals 214) and PE_GAIN (represented by error signal 714) to generate control signals 860 representing a gain code, and provide control signals 860 to digital controller and storage 840. Control signals 860 can include control signals 640 of FIG. 6A and FIG. 6D. As described above, through the correlation operation, a relationship between the Res and the gain error cycle period error component can be determined, and the gain correction code can be determined from the relationship. The correlation operation can be performed as part of an on-line or continuous calibration operation to reduce disruption to the generation of clock signal 104.

Also, INL error circuit 826 performs a correlation based on Res (represented by control signals 214) and PE_INL (represented by error signal 716) to generate control signals 832 representing an INL adjustment value (referred below as INL_adj), and provide control signals 832 to INL compensation circuit 828.

INL compensation circuit 828 receives Res and INL_adj, and based thereon, determines a main code representing the compensated Res. In some examples, INL compensation circuit 828 includes an adder that adds a compensation code, or includes a multiplier that multiplies with a scaling factor, to the Res value to generate the compensated Res as part of control signals 614. The compensation code and the scaling factor can be based on INL_adj 832. In some examples, INL compensation circuit 828 may also include registers that store data associated with determination of the compensated Res and the registers may be clocked by intermediate divided clock signal 210 (from MM divider 202) or may be clocked by clk_out 104. In some examples, INL compensation circuit 828 may perform computations (e.g., such as via an adder), refer to a look-up table (LUT), or other forms of mapping table, based on its received input signals. INL compensation circuit 828 provides the compensated Res as the main code in control signals 864 to digital controller and storage 840. Control signals 864 can include control signals 614 of FIG. 6A and FIG. 6D. Control signals 614 can be provided to DTC 204 to set the portion of instantaneous DTC delay that has not been corrected for mismatch but for which gain correction has been applied according to proper control of 640. In other examples, the addition of the compensation code based on INL_adj and Res is performed within DTC 204, and control signals 614 provided by INL compensation circuit 828 correspond to INL correction rather than compensated Res. In such examples, DTC 204 receives Res from delta-sigma modulator 206 (e.g., as part of control signals 214) and directly receives the compensation code from compensation circuit 828 (e.g., as part of control signals 614) based on INL_adj in place of the compensated Res.

INL compensation circuit 828 also generates control signals 834 representing the compensated Res which is provided to mismatch error circuit 830. Control signals 834 correspond to control signals 864/614 with appropriate delays applied such that control signals 864/614 and 624 are properly synchronized in time (e.g., with respect to clock signal 104), with intermediate signals such as control signals 834 adjusted to achieve such synchronization at the DTC. This is true even in the case where control signals 864/614 correspond to the Res signal without compensation as discussed above, since mismatch correction is performed relative to the main control elements within DTC 204 that are controlled by control signals 864/614.

Further, mismatch error circuit 830 performs a correlation operation between PE_MISMATCH (represented by control signals 718) and the compensated Res signal 834 to generate a correction code, and provides control signals 644 representing the correction code to mismatch compensation circuit 831. Mismatch compensation circuit 831 then generates control signals 874 including the correction code based on control signals 644 and 834. Control signals 874 can include control signals 624. In some examples, mismatch compensation circuit 831 can include components of the auxiliary delay element control circuit 630 of FIGS. 6B and 6C. In such examples, auxiliary delay element control circuits 630 of FIG. 6B and FIG. 6C can be omitted from DTC 204. In some examples, processing circuit 831 can be omitted if DTC 204 includes auxiliary delay element control circuit 630.

Also, digital controller and storage 840 can receive control signals 860 including the gain code, control signals 864 including the main code, and correction signals 874 including the correction code, and provide control signals 640 (including gain code), control signals 614 (including the main code), and control signals 624 (including the correction code) to DTC 204. For example, during a gain calibration operation (on-line or off-line), digital controller and storage 840 can receive updated control signals 860 from gain error circuit 824 and forward the updated control signals 860 as control signal 640. Also, during an INL calibration operation, digital controller and storage 840 can receive updated control signals 864 from INL compensation circuit 828 and forward the updated control signals 864 as control signal 614. Further, during a mismatch calibration operation, digital controller and storage 840 can receive updated control signals 874 from mismatch compensation circuit 831 (or auxiliary delay element control circuit 630) or 644 from 830, and forward the updated control signals 874 as control signal 624.

Also, digital controller and storage 840 can store a mapping between Res values and gain codes, main codes, and correction codes included in the respective control signals 860, 864, and 874, and provide those codes to DTC 204 after the calibration operation ends or in a case where calibration circuit 700 (or calibration operation) is disabled. Digital controller and storage 840 can receive a particular Res value as part of control signals 214, and retrieve the gain code, main code, and correction code for a particular Res value from storage 840, or perform interpolation operations for Res values not found in storage 840, and generate control signals 640 including the gain code, control signals 614 including the main code, and control signals 624 including the correction code. In some examples, digital controller and storage 840 can also selectively enable/disable gain error circuit 824, INL error circuit 826, INL compensation circuit 828, and mismatch error circuit 830. Digital controller and storage 840 can retrieve the gain code from storage 840 based on Res upon disabling gain error circuit 824, retrieve the main code based on Res from storage 840 upon disabling INL error circuit 826 and INL compensation circuit 828, and retrieve the correction code based on the main code from storage 840 upon disabling mismatch error circuit 830. Also, digital controller and storage 840 can monitor the codes generated from the enabled gain error circuit 824/INL compensation circuit 828/mismatch error circuit 830 or 831 to facilitate test functionality or monitoring for potential error conditions (such as saturation of correction values) and taking possible corrective steps such as altering an offset as described below for FIG. 14. Digital controller and storage 840 can also be synchronized to clock signal 104. In some implementations, 840 can also be synchronized to 210.

Figure 9A:
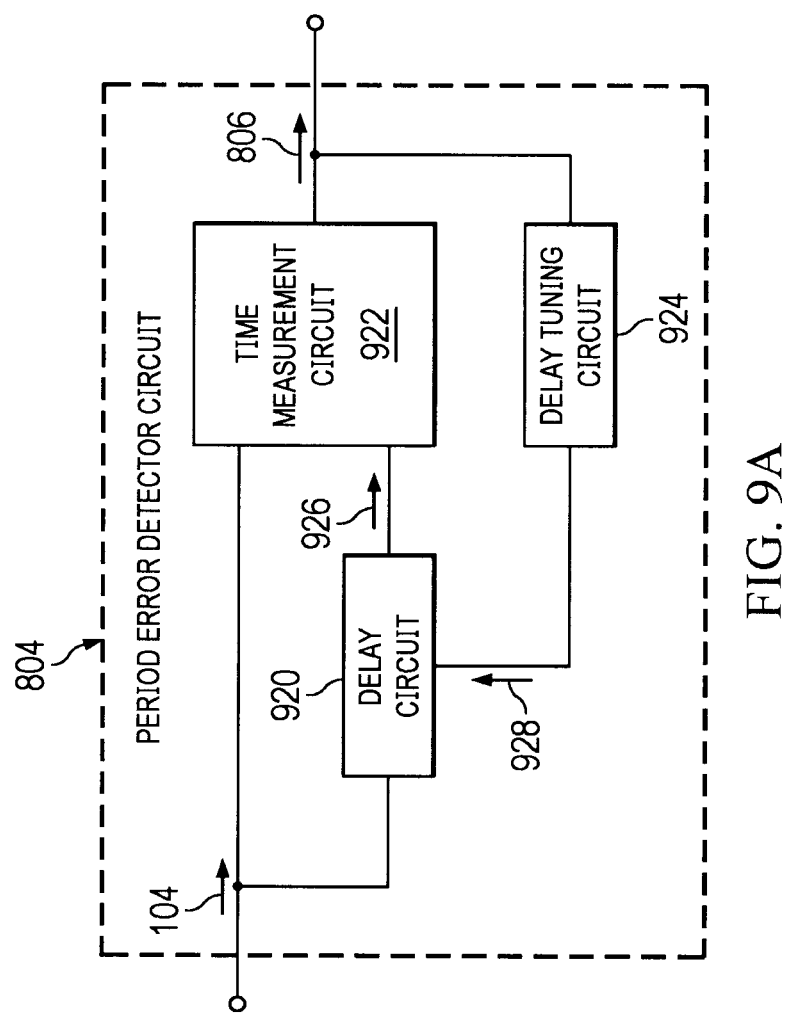
FIG. 9A is a schematic of an internal component of the calibration circuit of FIG. 8, in accordance with various examples.
Figure 9B:
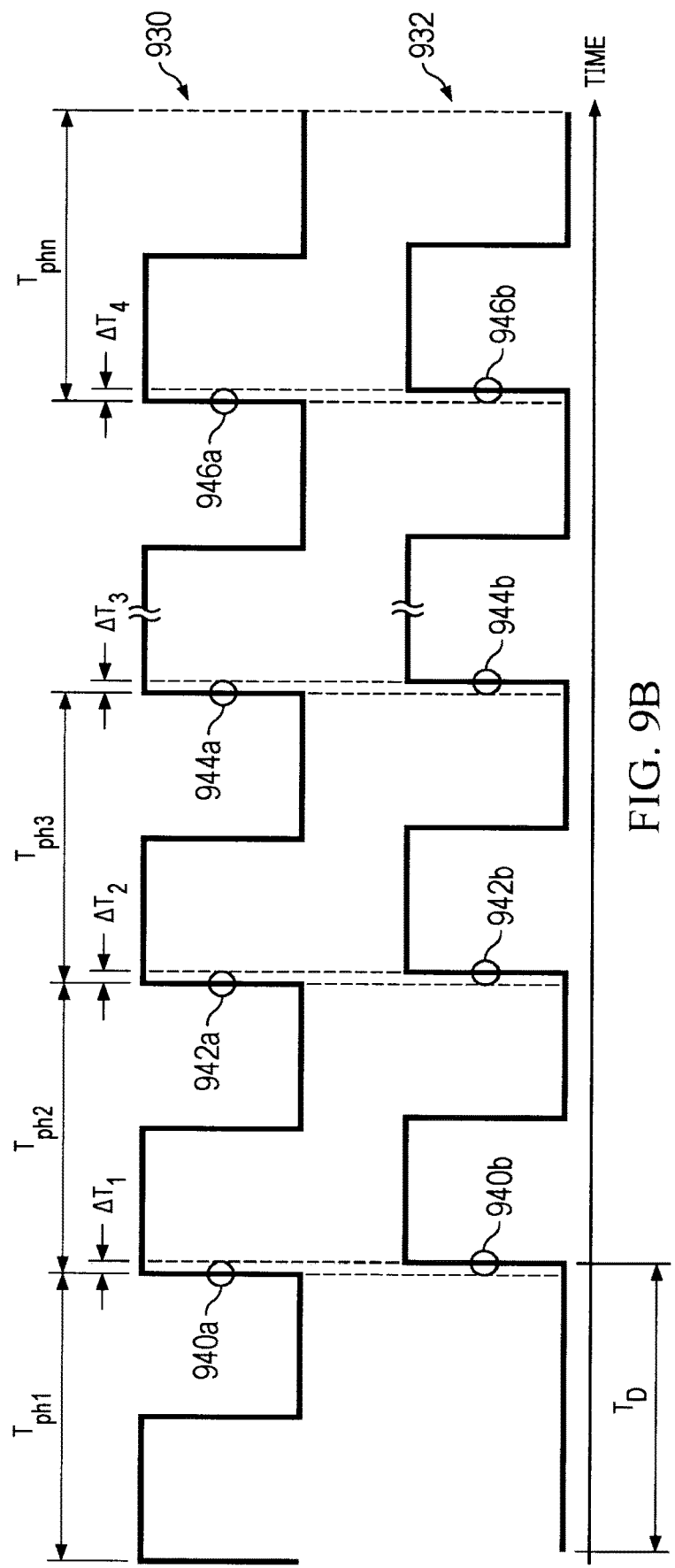
FIG. 9B includes graphs that illustrate example operations of the internal component of FIG. 9A, in accordance with various examples.

FIG. 9A is a schematic illustrating example internal components of period error detector circuit 804, and FIG. 9B includes graphs that illustrate example operations of period error detector circuit 804. Referring to FIG. 9A, period error detector circuit 804 includes a delay circuit 920, a time measurement circuit 922, and a delay tune circuit 924. Delay circuit 920 has an input to receive clock signal 104, and generate clock signal 926 as a delayed version of clock signal 104. Delay circuit 920 can delay clock signal 104 by a delay $T_D$ that equals one or more target/average cycle periods of clock signal 104. Delay circuit 920 can receive control signals 928 from delay tune circuit 924 to set delay $T_D$. In some examples, delay tune circuit 924 can set delay $T_D$ based on an average of cycle period errors in error signals 806. For example, delay tune circuit 924 can set delay $T_D$ so that the cycle period errors center around an average error value (e.g., zero) rather than skewing away from the average error value. Delay tune circuit 924 may include a digital decimator and accumulator to down-sample and accumulate the cycle period errors to determine average error values across multiple cycle periods. Delay tune circuit 924 may also include a delta sigma circuit to process the average error values to reduce the bit size of the error values and to shape the resulting quantization noise. In some examples, delay tune circuit 924 can provide control signals 928 including a set of digital values representing the output of the accumulator or delta-sigma modulator to delay circuit 920 in order to set delay $T_D$. In some examples, delay tune circuit 924 can include a digital to analog converter (DAC) and an analog filter to convert the digital values to an analog signal, and provide the analog signal to delay circuit 920 in order to set delay $T_D$. Example internal components of delay circuit 920 are illustrated in FIG. 10, and example internal components of delay tune circuit 924 are illustrated in FIG. 11, as to be described below.

Time measurement circuit 922 can have a first input to receive clock signal 104, and a second input coupled to the output of delay circuit 920 to receive clock signal 926. Time measurement circuit 922 can measure a time difference between an edge of clock signal 104 and an edge of clock signal 926 (delayed version of clock signal 104). The time difference can represent a deviation of a cycle period from the target cycle period as a cycle period error. In some examples, time measurement circuit 922 can include a time-to-digital converter circuit. In some examples, time measurement circuit 922 can include a bang-bang detector circuit, which can allow a high precision and a high speed operation, while the non-linear characteristic of the bang-bang detector circuit, combined with jitter, can be mitigated after averaging.

FIG. 9B includes graphs 930 and 932 that illustrate an example operation of period error detector circuit 804. Graph 930 represents clock signal 104, and graph 932 represents clock signal 926, which is delayed from clock signal 104 by the delay $T_D$. With delay $T_D$ equal to a target cycle period, time measurement circuit 922 can measure a first time difference ($\Delta T_1$ in FIG. 9B) between the edges 940a of clock signal 104 and edge 940b of clock signal 926 as the deviation of $T_{ph1}$ from $T_D$. In some examples, the first time difference $\Delta T_1$ can also indicate whether edge 940a leads or lags behind edge 940b. Time measurement circuit 922 can also measure a second time difference ($\Delta T_2$ in FIG. 9B) between the edge 942a of clock signal 104 and edge 942b of clock signal 926 as the deviation of $T_{ph2}$ from $T_D$. In some examples, the second time difference $\Delta T_2$ can also indicate whether edge 942a leads or lags behind edge 942b. Time measurement circuit 922 can also measure a third time difference ($\Delta T_3$ in FIG. 9B) between edge 944a of clock signal 104 and edge 944b of clock signal 926 as the deviation of $T_{ph3}$ from $T_D$. In some examples, the third time difference $\Delta T_3$ can also indicate whether edge 944a leads or lags behind edge 944b. Further, time measurement circuit 922 can also measure an n-th time difference ($\Delta T_n$ in FIG. 9B) between edge 946a of clock signal 104 and edge 946b of clock signal 926 as the deviation of $T_{phn}$ from $T_D$. In some examples, the n-th time difference $\Delta T_n$ can also indicate whether edge 946a leads or lags behind edge 946b. Time measurement circuit 922 can provide an average of the time differences as error signal 806.

Figure 10:
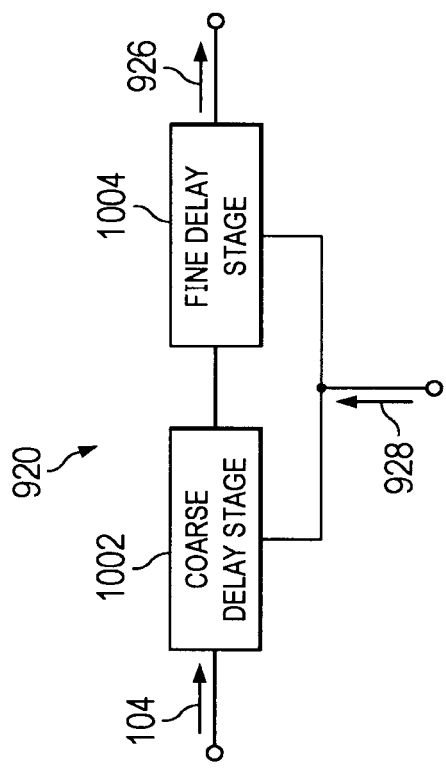
FIG. 10 is a schematic of another internal component of the calibration circuit of FIG. 8, in accordance with various examples.
Figure 11:
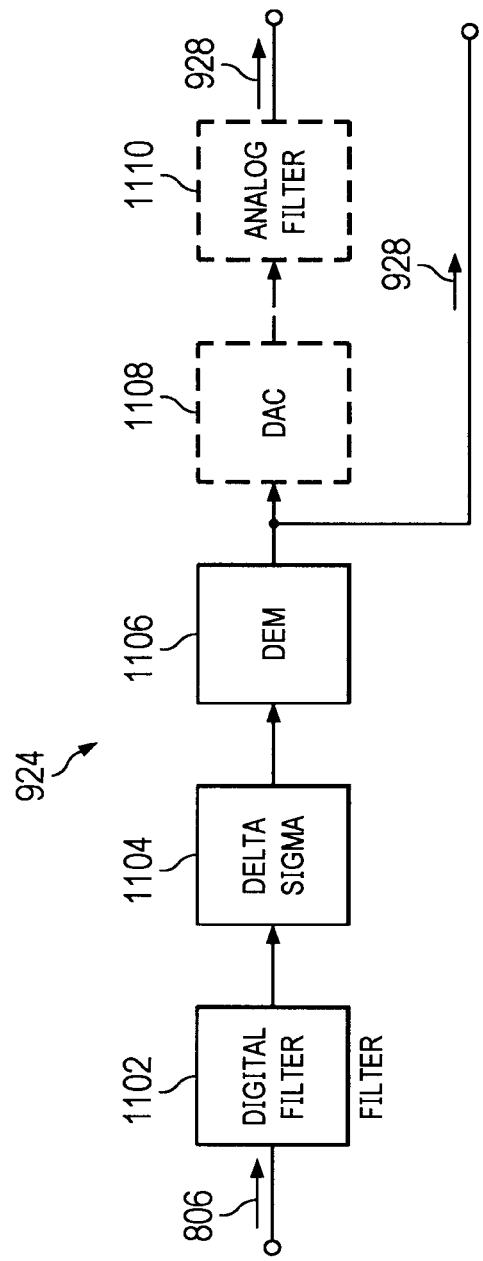
FIG. 11, FIG. 12, FIG. 13, and FIG. 14 are schematics of internal components of the calibration circuit and the processing circuit of FIG. 8, in accordance with various examples.

FIG. 10 is a schematic of an example delay circuit 920 of period error detector circuit 804. In an example, delay circuit 920 can include coarse delay stage 1002 and fine delay stage 1004 coupled in series/cascade to generate clock signal 926 by delaying clock signal 104 by a delay $T_D$. In some examples, fine delay stage 1004 follows coarse delay stage 1002 in cascade fashion as indicated in FIG. 5, and in other examples fine delay stage 1004 precedes coarse delay stage 1002 in cascade fashion. Coarse delay stage 1002 allows adjustment of delay $T_D$ in relatively large steps, and fine delay stage 1004 allows adjustment of delay $T_D$ in relatively small steps. In some examples, coarse delay stage 1002 can include a set of cascades of inverters/buffers, and coarse delay adjustment can be implemented by selectively multiplexing a different number of inverters/buffers into the delay path. In some examples, fine delay stage 1004 can include a buffer (or cascades of buffers) having adjustable capacitance coupled to the buffer, and fine delay adjustment can be implemented by adjusting the capacitance of the capacitor. In some examples, control signals 928 can be in the form of a digital signal, where coarse delay stage 1002 can receive and be programmed by a coarse control contained within control signals 928, and fine delay stage 1004 can receive and be programmed by a fine control signals contained within control signals 928. In some examples, course delay stage 1002 can provide digital adjustment of delay $T_D$, and fine delay stage 1004 can provide analog adjustment of delay $T_D$. In some examples, delay circuit 920 may only include fine delay stage 1004 if $T_D$ is sufficiently low in value, such as when clock signal 104 has a relatively high frequency.

FIG. 11 is a schematic illustrating internal components of delay tuning circuit 924, in accordance with various examples. Referring to FIG. 11, delay tuning circuit 924 can include a digital filter 1102 (which may include a decimator, accumulator, and/or other filtering), a delta-sigma circuit 1104, and a dynamic element matching (DEM) circuit 1106, to generate control signals 928 in digital form. In a case where delay tuning circuit 924 generates an analog control signals 928, delay tuning circuit 924 may further include a DAC 1108 and an analog filter 1110 to convert the digital control signals 928 into an analog version, and provide control signals 928 in analog form. In some examples, a DEM is not required. In some examples, a Delta Sigma is not required.

In an example of operation, delay tuning circuit 924 receives samples of error signal 806 from time measurement circuit 922. Digital filter 1102 can perform various operations on the samples of error signal 806, such as a decimation/down sampling operation to reduce sample rate to be processed by subsequent blocks of delay tuning circuit 924, which can reduce power consumption. Digital filter 1102 can also perform lowpass filtering operations and implement the required open loop DC gain to achieve a desired closed loop bandwidth of the delay tuning operation (which involves the overall feedback path consisting of circuits 924, 920, and 922). Higher open loop DC gain provided by digital filter 1102 can lead to a higher closed loop bandwidth, whereas lower open loop DC gain provided by digital filter 1102 can lead to a lower closed loop bandwidth. The preferred closed loop bandwidth may be different during steady-state operation in which low noise is required versus during initial operation or after a disturbance in which fast settling is required. In order to accommodate these two different cases, digital filter 1102 can include a gear shifting mechanism such that lower gain is utilized during steady-state operation to achieve low noise, and higher gain is utilized to facilitate fast settling. In the case of lower gain for digital filter 1102, the closed loop bandwidth of the delay tuning loop is reduced which leads to decreased noise but increased settling time. In the case of higher gain for digital filter 1102, the closed loop bandwidth of the delay tuning loop is increased which leads to increased noise but decreased settling time.

Also, delta sigma circuit 1104 can reduce bit-width signal at its output and provide shaping of the resulting quantization noise, so that noise power can be concentrated at higher frequencies outside a frequency of interest (e.g., the bandwidth at which calibration signals are updated). The output of delta sigma circuit 1104 is coupled to the input of DEM circuit 1106, which converts the signal to a thermometer code with dynamic element operation applied. An example of dynamic element operation is barrel shifting a thermometer code. In case of analog control of delay circuit 920, the output of DEM circuit 1106 is coupled to the input of DAC 1108, the output of DAC 1108 is coupled to the input of analog filter 1110, and the output of analog filter 1110 is coupled to delay circuit 920 to provide control signals 928. In an example, analog filter 1110 is a lowpass filter that removes high frequency noise introduced by the delta sigma 1104 and DEM circuit 1106. In the case of digital control of delay circuit 920, the output of DEM circuit 1106 is coupled to the input of delay circuit 920 to provide control signals 928. In some examples, delta sigma circuit 1104 and/or DEM 1106 can be omitted, and the output of digital filter 1102 can provide control signals 928 to delay circuit 920. In other examples, delta sigma circuit 1104 and/or DEM 1106 can be omitted, and the output of digital filter 1102 can be provided to DAC 1108 in case of analog control of delay circuit 920.

Figure 12:
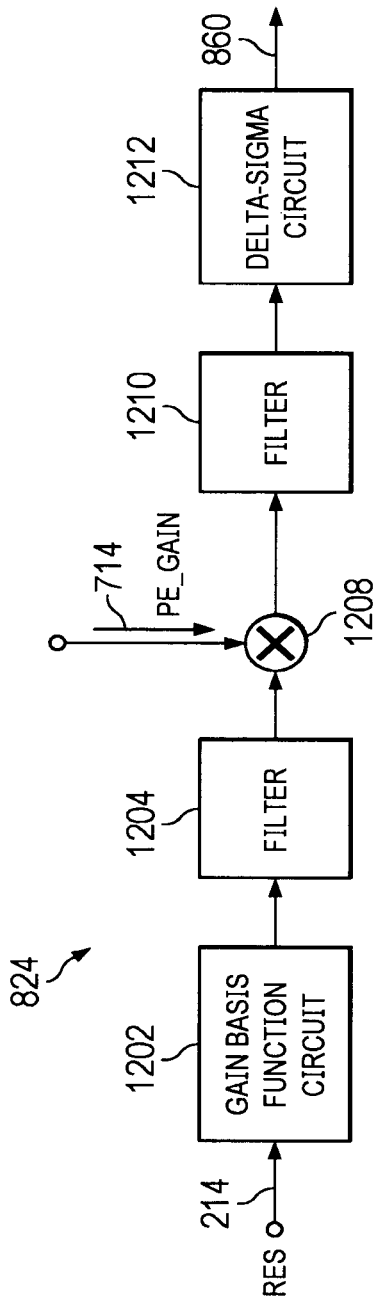

FIG. 12 is a schematic illustrating internal components of gain error circuit 824, in accordance with various examples. In some examples, the gain error circuit 824 includes a basis function circuit 1202, a filter 1204, a multiplier 1208, and a filter 1210, and a delta-sigma circuit 1212 each coupled sequentially and serially between the first input of gain error circuit 824 and the output of gain error circuit 824. In an example, basis function circuit 1202 maps a Res value from control signals 214 into an output signal according to a basis function, which can be implemented in LUT, logic operations, or computations including multiplication, addition, and/or scaling. In some examples, filter 1204 includes a first order difference filter. In yet other examples, filter 1204 includes a serial cascade of first order difference filters. In yet other examples, filter 1204 includes any other suitable filter to achieve a particular performance from correlation operations. In yet other examples, filter 1204 is omitted. In some examples, delta-sigma circuit 1212 is omitted from the gain error circuit 824.

In an example of operation of gain error circuit 824, basis function circuit 1202 maps Res according to one or more basis functions, to provide a resulting signal which is filtered via filter 1204. The filtered signal undergoes correlation with a PE_GAIN value represented by error signal 714 as received at the second input of gain error circuit 824, via multiplication by multiplier 1208 and filtering provided by filter 1210. In some examples, filter 1210 includes an accumulator. In examples in which the delta-sigma circuit 1212 is omitted, the filter 1210 provides control signals 860 including a gain code to digital controller and storage 840. Digital controller and storage 840 can then forward control signals 860 as control signals 640, or retrieve one of the stored gain codes included in control signals 860 for a particular Res value and generate control signals 640 including the retrieved gain code, and provide control signals 640 to control the DTC 204 to correct, compensate for, or otherwise mitigate the determined gain error. As described above, a resistance of the pull-up path of DTC 204, or a current through the pull-up path of DTC 204, may be modified according to the gain adjustment value to correct for the determined gain error. In examples in which the delta-sigma circuit 1212 is included, delta-sigma circuit 1212 can provide control signals 860 representing the gain code with a reduced number of bits to digital controller and storage 840, with corresponding truncation noise being noise shaped by the delta-sigma circuit 1212.

Figure 13:
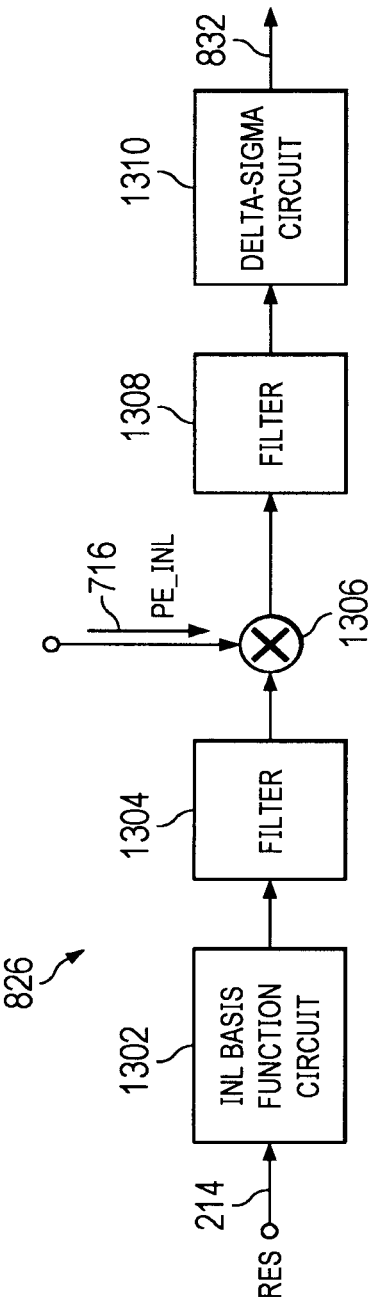

FIG. 13 is a schematic illustrating internal components of INL error circuit 826, in accordance with various examples. In some examples, INL error circuit 826 includes a basis function circuit 1302, a filter 1304, a multiplier 1306, a filter 1308, and a delta-sigma circuit 1310 each coupled sequentially and serially between the first input of INL error circuit 826 and the output of INL error circuit 826. In an example, basis function circuit 1302 maps a Res value from control signals 214 into an output signal according to a basis function, which can be implemented in LUT, logic operations, or computations including multiplication, addition, and/or scaling. In some examples, filter 1304 includes a first order difference filter. In yet other examples, filter 1304 includes a serial cascade of first order difference filters. In yet other examples, filter 1304 includes any other suitable filter to achieve a particular performance from correlation operations. In yet other examples, filter 1304 is omitted. In some examples, delta-sigma circuit 1310 is omitted from INL error circuit 826.

In an example of operation of the INL error circuit 826, basis function circuit 1302 maps Res according to one or more basis functions, to provide a resulting signal which is filtered via the filter 1304. The filtered signal undergoes correlation with a PE_INL value represented by error signal 716 via multiplication by multiplier 1306 and filtering by filter 1308. In some examples, filter 1308 includes an accumulator. In examples in which delta-sigma circuit 1310 is omitted, filter 1308 provides control signals 832 including INL_adj to INL compensation circuit 828 to cause INL compensation circuit 828 to determine the compensated residual error code, as described above. In examples in which the delta-sigma circuit 1310 is included, delta-sigma circuit 1310 can provide control signals 832 representing INL_adj with a reduced number of bits to INL compensation circuit 828 with corresponding truncation noise being noise shaped by the delta-sigma circuit 1310.

Figure 14:
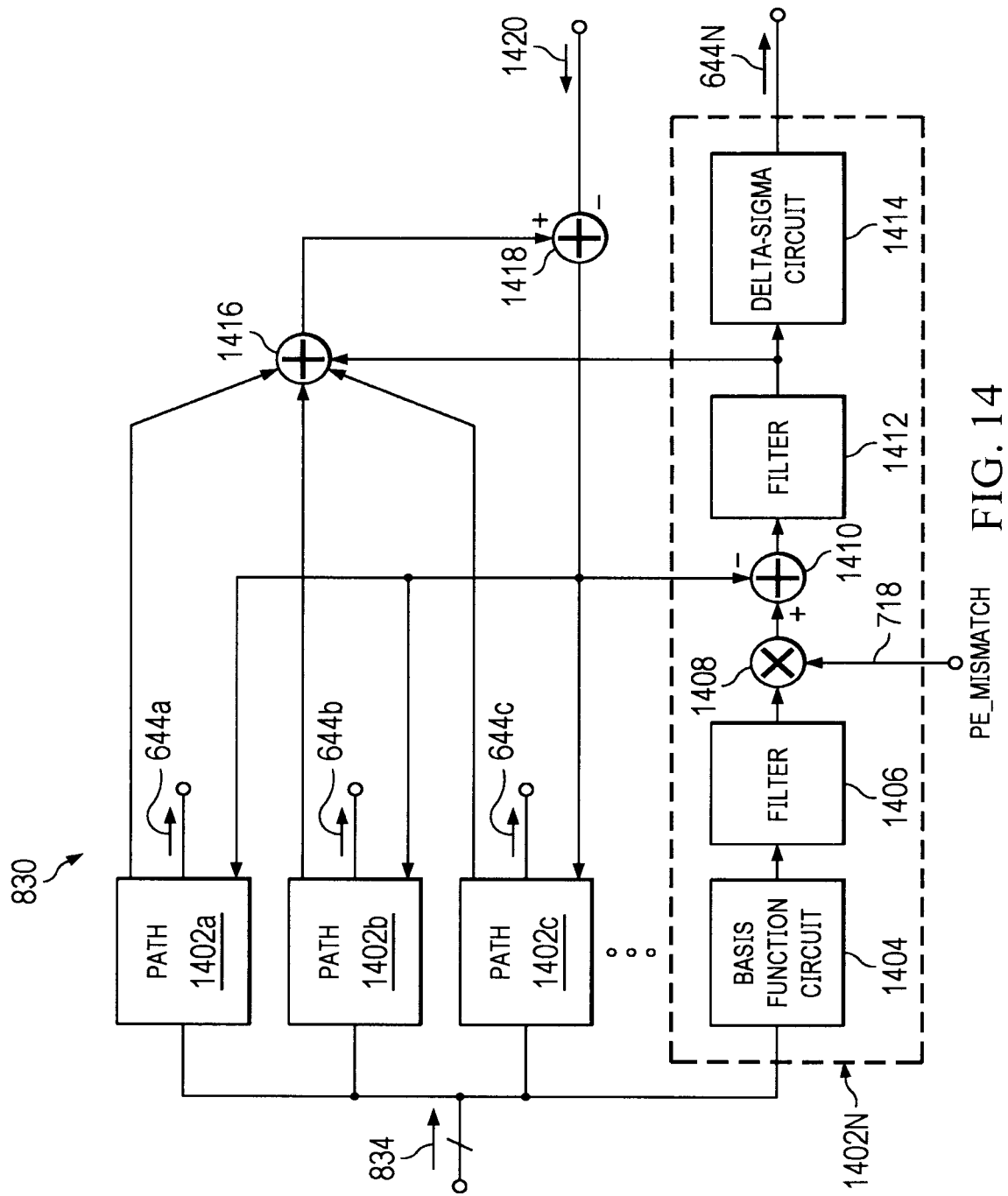

FIG. 14 is a schematic illustrating internal components of mismatch error circuit 830, in accordance with various examples. In some examples, the mismatch error circuit 830 includes multiple processing paths 1402, including processing paths 1402a, 1402b, 1402c, ... 1402N. Each processing path is configured to process one binary bit of the compensated Res represented in control signals 614, as described above, and generate control signals 644 for a particular auxiliary delay element. For example processing path 1402a generates control signals 644a for auxiliary capacitor 620a/current source 660a, processing path 1402b generates control signals 644b for auxiliary capacitor 620b/current source 660b (not shown in FIGS. 6A-6D), processing path 1402c generates control signals 644c for auxiliary capacitor 620c/current source 660c (not shown in FIGS. 6A-6D), and processing path 1402N generates control signals 644N for auxiliary capacitor 620N or auxiliary current source 660N. As described above, in some examples mismatch error circuit 830 can provide control signals 644 to mismatch compensation circuit 831, which can then generate control signals 874 including the correction code based on control signals 644 and 834. In some examples, mismatch error circuit 830 can also provide control signals 644 to auxiliary delay element control circuit 630 to generate control signals

624 including the correction code. For the sake of simplicity, only one path of 1402, namely 1402N, is shown and described in detail.

In an example, each processing path 1402 includes a basis function circuit 1404, a filter 1406, a multiplier 1408, an adder 1410, a filter 1412, and a delta-sigma circuit 1414. In an example, the basis function circuit 1404 maps a particular binary bit of the compensated Res 834 into an output signal according to a basis function. The basis function can output the state of a binary bit of the compensated Res, and the basis function circuit 1404 of each processing path 1402 can provide different binary bit states for the compensated Res value. For example, basis function circuit 1404 of processing path 1402a may map the MSB of Res value to a value of 1 or −1 depending on whether the LSB of Res is 1 or 0, respectively, and basis function circuit 1404 of processing path 1402N may map the LSB of Res value to a value of 1 or −1 depending on whether the MSB of Res is 1 or 0, respectively. As an example, for a 10-bit compensated Res value having a value of "100 . . . 0", basis function circuit 1404 of processing path 1402a (MSB) may output a value of 1 and basis function circuit 1404 of processing path 1402N (LSB) may output a value of −1. Basis function circuit 1404 can be in the form of an LUT, or can include arithmetic circuits to perform computations such as multiplication, addition, and/or scaling. In some examples, the filter 1406 is a first order difference filter. In yet other examples, the filter 1406 is a serial cascade of first order difference filters. In yet other examples, the filter 1406 is any other suitable filter to achieve a particular performance from correlation operations. In yet other examples, filter 1406 is omitted. Also, in some examples the delta-sigma circuit 1414 is omitted from the mismatch error circuit 830.

In some examples, the basis function circuit 1404 has an input coupled to the output of the INL compensation circuit 828 to receive control signals 834 including the compensated Res, and an output. The filter 1406 has an input coupled to the output of the basis function circuit 1404 and an output. The multiplier 1408 has a first input coupled to the output of the filter 1406, a second input coupled to the output of mismatch error filter 818 to receive error signal 718 (PE_mismatch), and an output. The adder 1410 has a first input coupled to the output of the multiplier 1408, a second input, and an output. The filter 1412 has an input coupled to the output of the adder 1410, and an output. In some examples, filter 1412 may include an accumulator. In examples in which the delta-sigma circuit 1414 is omitted, the output of the filter 1412 is coupled to the fourth input of the DTC 204. In examples in which the delta-sigma circuit 1414 is included, the delta-sigma circuit 1414 has an input coupled to the output of the filter 1412 and an output coupled to the fourth input of the DTC 204. The mismatch error circuit 830 also includes an adder 1416 and an adder 1418. The adder 1416 has a number of inputs equal to a number of processing paths 1402 of the mismatch error circuit 830, where each input of the adder 1416 is uniquely coupled to the output of filter 1412. The adder 1418 has a first input coupled to the output of the adder 1416, a second input that receives an offset value 1420, and an output coupled to the second input of the adder 1410. The offset value is determined according to a desired steady state value of the sum of all filter 1412 outputs, which can represent the added delay by the auxiliary delay elements (e.g., auxiliary capacitors 620, auxiliary current sources 660, etc.). In some examples, the offset value is zero to reduce/eliminate the impact of the enabling of auxiliary delay elements on the gain error of DTC 204, to reduce/eliminate the impact of mismatch error circuit 830 on the gain code determined by gain error circuit 824.

In an example of operation of the mismatch error circuit 830, the code basis circuit receives a respective bit of the compensated residual error code from the INL compensation circuit 828 and maps the received bit according to a basis function. For example, the basis function may map a zero bit value of the compensated residual error code to a −1 value, and a one bit value of the compensated residual error code to a 1 value, each based on the basis function. The mapped bit is filtered by the filter 1406 and correlated with error signal 718 representing PE_mismatch via the multiplier 1408 and the filter 1412 to provide a correlation result. An output value of the adder 1416 is subtracted from the input of filter 1412 by the adder 1410. In some examples, the subtraction constrains a collective sum of outputs of the filter 1412 to a programmed value. Such arrangements can reduce the impact of the addition/removal of auxiliary delay elements (e.g., auxiliary capacitors 620, auxiliary current sources 660) on the gain of DTC 204, which may otherwise add to the gain error of DTC 204. An output value of the adder 1410 is provided to the input of filter 1412, and output signal of filter 1412 is provided to the delta-sigma circuit 1414 for bit truncation and dithering, such as to reduce periodicity of quantization noise. Control signals 644 provided by the delta-sigma circuit 1414 can present a mismatch adjustment value or a correction code to be provided to the DTC 204. In some examples in which the delta-sigma circuit 1414 is omitted, filter 1412 can provide the control signal 644. Mismatch compensation circuit 831 (or auxiliary delay element control circuit 630) can then convert control signals 644 to control signals 624, and provide control signals 624 to auxiliary capacitors 620/auxiliary current sources 660.

Figure 15:
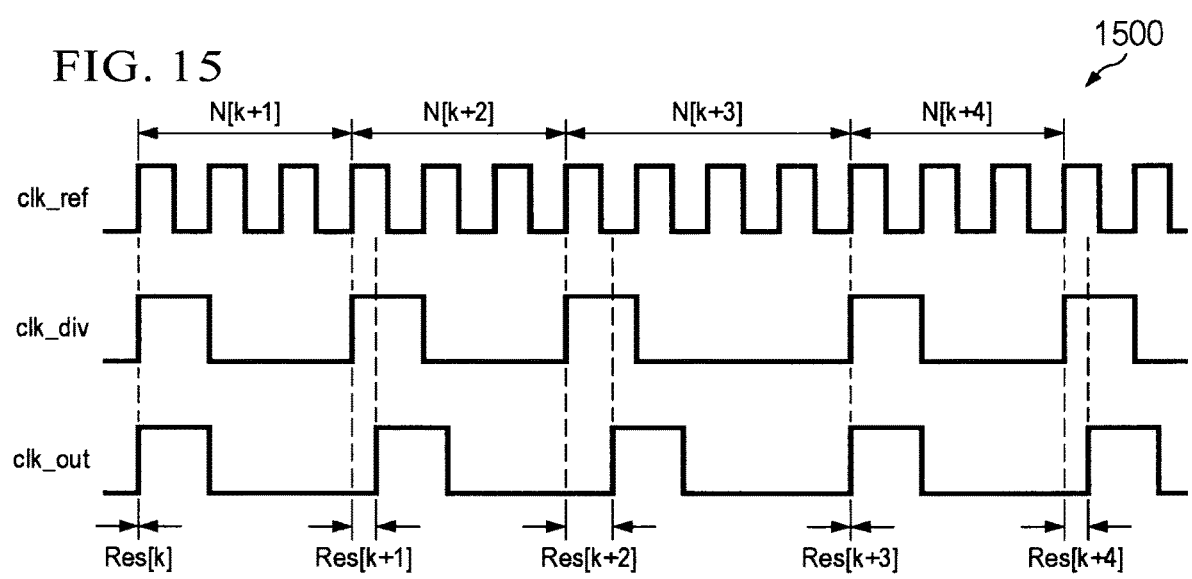
FIG. 15 is a timing diagram of signals in a clock divider, in accordance with various examples.

FIG. 15 is a timing diagram 1500 of signals in the clock divider 102, in accordance with various examples. The timing diagram 1500 shows clk_ref, clk_div, and clk_out. Clk_ref can represent clock signal 103, clk_div can represent intermediate divided clock signal 210, and clk_out can represent clock signal 104. As shown by the timing diagram 1500, clk_div may have periods of different time duration (e.g., jitter) that are corrected by a DTC, such as the DTC 204, as controlled according to the described error correction techniques that may utilize the gain adjustment value, compensation residual error, and mismatch error adjustment values, in forming clk_out.

Figure 16:
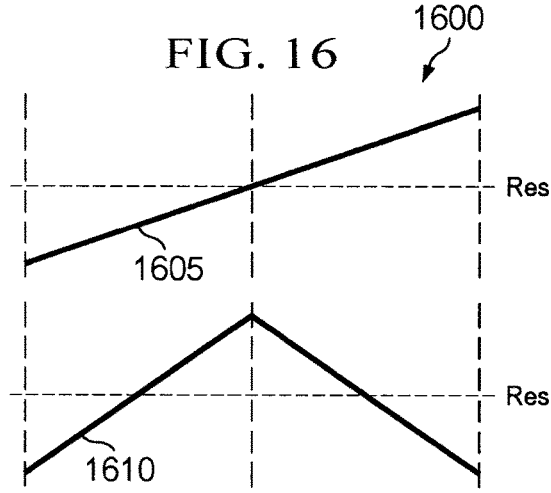
FIG. 16 includes graphs of basis functions that can be implemented in the calibration circuit of FIG. 8, in accordance with various examples.

FIG. 16 includes graph 1600 of basis functions that can be implemented in a basis function circuit, such as basis function circuits 1202 and 1302, in accordance with various examples. The graph 1600 shows a gain basis function 1605 and an INL basis function 1610. In some examples, gain basis function 1605 and INL basis function 1610 are orthogonal and each have zero mean value. In other examples, gain basis function 1605 and INL basis function 1610 may be non-orthogonal and/or a non-zero mean component may be introduced.

Figure 17:
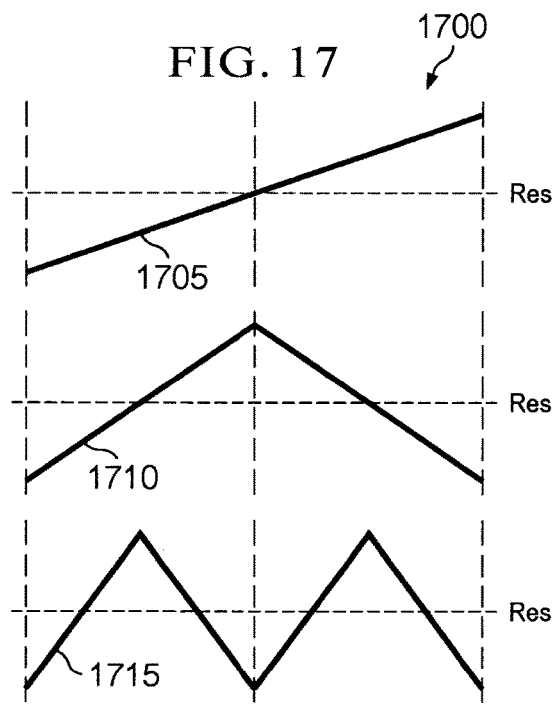
FIG. 17 includes graphs of basis functions that can be implemented in the calibration circuit of FIG. 8, in accordance with various examples.

FIG. 17 includes graph 1700 of basis functions that can be implemented in a basis function circuit, such as basis function circuits 1202 and 1302, in accordance with various examples. The graph 1700 shows a gain basis function 1705, a fundamental INL basis function 1710, and a $2^{nd}$ harmonic INL basis function 1715. In some examples, the gain basis function 1705, the fundamental INL basis function 1710, and the $2^{nd}$ harmonic INL basis function 1715 are orthogonal and each have zero mean value. In other examples, the gain basis function 1705, the fundamental INL basis function 1710, and the 2$^{nd}$ harmonic INL basis function 1715 may be non-orthogonal and/or a non-zero mean component may be introduced.

Figure 18:
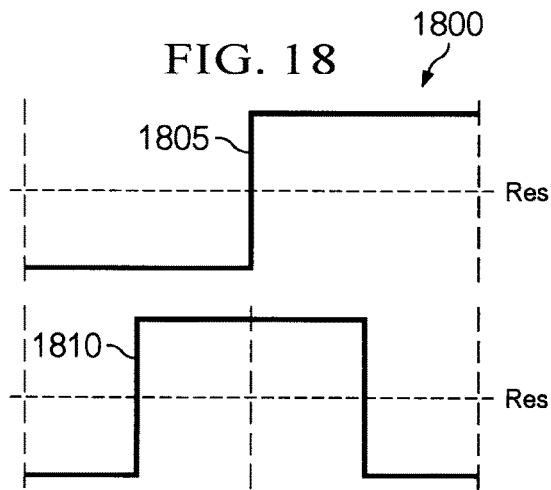
FIG. 18 includes graphs of basis functions that can be implemented in the calibration circuit of FIG. 8, in accordance with various examples.

FIG. 18 includes graph 1800 of basis functions that can be implemented in a basis function circuit, such as basis function circuits 1202 and 1302, in accordance with various examples. The graph 1800 shows a gain basis function 1805 and an INL basis function 1810. In some examples, the gain basis function 1805 and the INL basis function 1810 are orthogonal and each have zero mean value. In other examples, the gain basis function 1805 and the INL basis function 1810 may be non-orthogonal and/or a non-zero mean component may be introduced. In some examples, basis functions 1805 and 1810 are computationally simpler (e.g., require less computational complexity and/or power) than the basis functions of FIG. 16 and/or FIG. 17. In other examples, more complex basis functions may be useful, such as if performance increases resulting from the more complex basis functions is worthwhile relative to the increased computational complexity and/or power associated with computation of the more complex basis functions.

Figure 19:
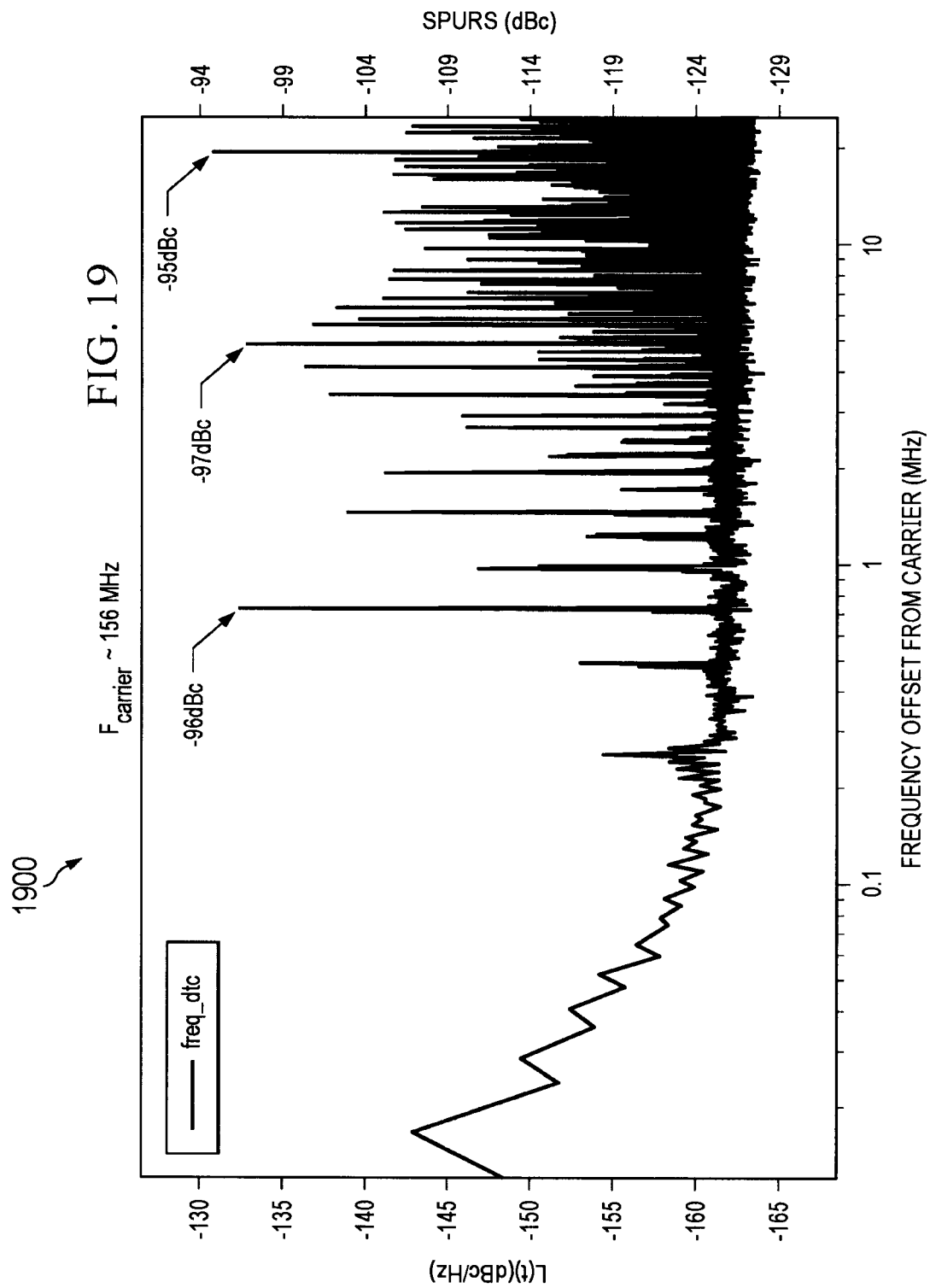
FIG. 19 includes a graph illustrating a phase noise spectrum of a clock divider with mismatch error correction disabled, in accordance with various examples.

FIG. 19 is a graph illustrating an example phase noise spectrum 1900 of clk_out (clock signal 104) with mismatch error correction disabled, in accordance with various examples. In some examples, clk_out is provided by the clock divider 102, as described above herein. As shown in FIG. 19, the left-side vertical axis is representative of spectral density (L(f)) in units of decibels relative to the carrier (dBc) per Hertz (Hz), the right-side vertical axis is representative of dBc, and the horizontal axis is representative of a frequency offset from a carrier frequency, in terms of megahertz (MHz). As shown by the phase noise spectrum 1900, in some examples of the clock divider 102 in which mismatch error correction is disabled, many spurs may be present, having a maximum magnitude of magnitude of approximately –95 dBc for a carrier frequency of about 156 MHz and Div_Val of 64.0313971.

Figure 20:
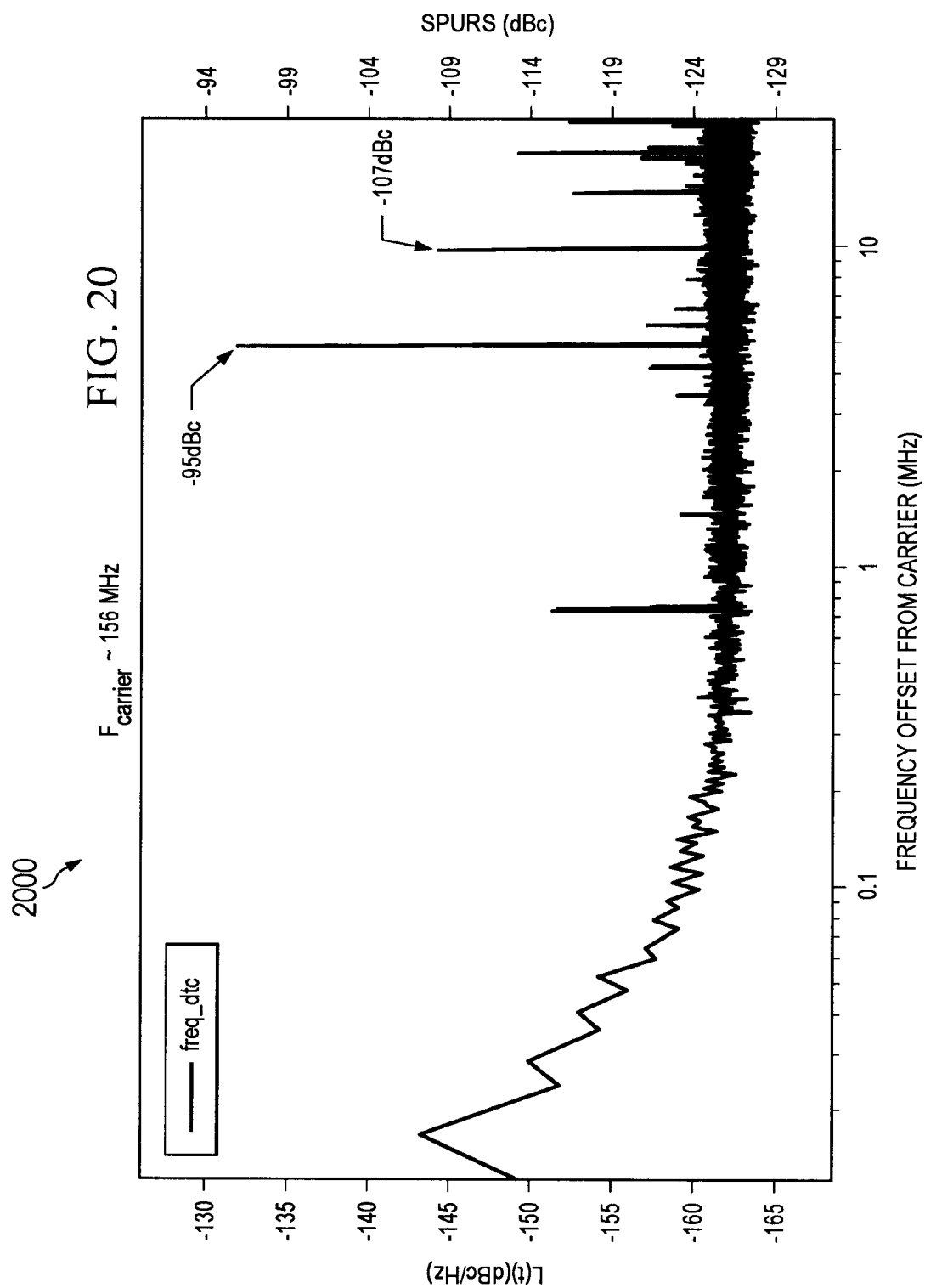
FIG. 20 includes a graph illustrating a phase noise spectrum of a clock divider with mismatch error correction enabled, in accordance with various examples.

FIG. 20 is a graph illustrating an example phase noise spectrum 2000 of clk_out (clock signal 104) with mismatch error correction enabled, in accordance with various examples. In some examples, clk_out is provided by the clock divider 102, as described above herein. A description of units of the axes of FIG. 20, the carrier frequency, and the Div_Val may be the same as those of FIG. 19. As shown by the phase noise spectrum 2000, in some examples of the clock divider 102 in which mismatch error correction is enabled, the quantity of spurs is reduced from the quantity shown in FIG. 19, and an average magnitude of the spurs is decreased from an average magnitude shown in FIG. 19.

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signals provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. An apparatus comprising:
   a multi-modulus (MM) divider having a clock input, a first divisor input and a MM divider output;
   a delta-sigma modulator having a second divisor input, a divisor output and a residual output, the divisor output coupled to the first divisor input;
   a digital-to-time converter (DTC) having a DTC clock input, a DTC control input, a DTC calibration input, and a DTC output; and
   a processing circuit having a residual input, a main code output, and a correction code output, the residual input coupled to the residual output, the main code output coupled to the DTC control input, and the correction code output coupled to the DTC calibration input.

2. The apparatus of claim 1, wherein the DTC calibration input is a first DTC calibration input, the DTC has a second DTC calibration input, and the DTC configurable to:
receive a correction code at the first DTC calibration input;
receive a gain code at the second DTC calibration input;
receive a main code at the DTC control input; and
set a delay between the DTC clock input and the DTC output responsive to the main code, the gain code, and the correction code, and
wherein the processing circuit has a gain code output coupled to the second DTC calibration input.

3. The apparatus of claim 2, wherein the processing circuit includes a controller and storage circuit configurable to provide the main code, the correction code, and the gain code responsive to a residual signal at the residual input.

4. The apparatus of claim 3, wherein the processing circuit has a processing input; and
wherein the apparatus further comprises an error detection circuit having an input and an output, the input of the error detection circuit coupled to the DTC output, and the output of the error detection circuit coupled to the processing input.

5. The apparatus of claim 4, wherein the error detection circuit is configurable to:
receive a clock signal at the input;
generate a cycle error signal indicative of a cycle period error of the clock signal; and
provide the cycle error signal at the output; and
wherein the processing circuit is configurable to generate at least one of the gain code, the main code, or the correction code responsive to the cycle error signal.

6. The apparatus of claim 5, wherein the error detection circuit is configurable to generate the cycle error signal responsive to a time difference between a first edge of the clock signal and a second edge of a delayed version of the clock signal.

7. The apparatus of claim 6, wherein the error detection circuit includes:
a delay circuit having a delay input, a delay control input, and a delay output, the delay input coupled to the input of the error detection circuit, the delay circuit configurable to receive the clock signal at the delay input and, provide the delayed version of the clock signal at the delay output by delaying the clock signal responsive to a delay control signal at the delay control input; and
a time difference detection circuit having first and second clock inputs and a time difference output, the first clock input coupled to the input of the error detection circuit, the second clock input coupled to the delay output, and the time difference output coupled to the output of the error detection circuit, the time difference detection circuit configurable to generate the cycle error signal indicative of the time difference at the time difference output.

8. The apparatus of claim 7, wherein the delay circuit is configurable to delay the clock signal by an interval having at least an integer multiple of an average cycle period of the clock signal.

9. The apparatus of claim 7, wherein the error detection circuit includes a tuning circuit having an input and an output, the input of the tuning circuit coupled to the output of the error detection circuit, the output of the tuning circuit coupled to the delay control input, and the tuning circuit configurable to generate the delay control signal responsive to the cycle error signal.

10. The apparatus of claim 7, wherein the time difference detection circuit includes at least one of: a time-to-digital converter circuit, or a bang-bang detector circuit.

11. The apparatus of claim 7, wherein the processing input is a first processing input, and the output of the error detection circuit is a first output;
wherein the error detection circuit has a second output and a third output and includes:
a first filter coupled between the time difference output and the first output of the error detection circuit, the first filter configurable to generate a first filtered error signal responsive to the cycle error signal;
a second filter coupled between the time difference output and the second output of the error detection circuit, the second filter configurable to generate a second filtered error signal responsive to the cycle error signal; and
a third filter coupled between the time difference output and the third output of the error detection circuit, the third filter configurable to generate a third filtered error signal responsive to the cycle error signal; and
wherein the processing circuit has a second processing input and a third processing input, and the processing circuit is configurable to:
generate the gain code responsive to the first filtered error signal;
generate the main code responsive to the second filtered error signal; and
generate the correction code responsive to the third filtered error signal.

12. The apparatus of claim 11, wherein the processing circuit is configurable to:
generate the gain code responsive to a first correlation between the first filtered error signal and the residual signal;
generate an adjustment signal responsive to a second correlation between the second filtered error signal and the residual signal;
generate the main code and a compensated residual signal responsive to the adjustment signal and the residual signal; and
generate the correction code responsive to a third correlation between the third filtered error signal and the compensated residual signal.

13. The apparatus of claim 2, wherein the DTC includes:
a buffer having a buffer input and a buffer output, the buffer output coupled to the DTC output;
a voltage-controlled resistor and a first switch coupled between a first power terminal and the buffer input, the voltage-controlled resistor having a resistance control terminal coupled to the second DTC calibration input, and the first switch having a first switch control input coupled to the DTC clock input;
a second switch coupled between the buffer input and a second power terminal, the second switch having a second switch control input coupled to the DTC output; and
capacitors coupled between the buffer input and either the first or second power terminal, the capacitors including a set of main delay elements having main delay control terminals coupled to the DTC control input and a set of auxiliary delay elements having auxiliary delay control terminals coupled to the first DTC calibration input.

14. The apparatus of claim 13, wherein one of the first or second power terminals is a ground terminal.

15. The apparatus of claim 2, wherein the DTC includes:
a buffer having a buffer input and a buffer output, the buffer output coupled to the DTC output;
current sources and a first switch coupled between a first power terminal and the buffer input, each of the current sources having a current control terminal coupled to the second DTC calibration input, the first switch having a first switch control input coupled to the DTC clock input, in which the current sources include a set of main delay elements having main delay control terminals coupled to the DTC control input and a set of auxiliary delay elements having auxiliary delay control terminals coupled to the first DTC calibration input; and
a second switch coupled between the buffer input and a second power terminal, the second switch having a second switch control input coupled to the DTC output; and
capacitors coupled between the buffer input and either the first or second power terminal.

16. The apparatus of claim 15, wherein one of the first or second power terminals is a ground terminal.

17. An apparatus comprising:
a multi-modulus (MM) divider having a clock input, a first divisor input and a MM divider output;
a delta-sigma modulator having a second divisor input, a divisor output and a residual output, the divisor output coupled to the first divisor input;
a digital-to-time converter (DTC) having a DTC clock input, a DTC control input, a DTC calibration input, and a DTC output, the DTC control input coupled to the residual output, and the DTC clock input coupled to the MM divider output; and
a calibration circuit having a first calibration control input, a second calibration control input, and a calibration output, the first calibration control input coupled to the DTC output, the second calibration control input coupled to the residual output, and the calibration output coupled to the DTC calibration input.

18. The apparatus of claim 17, wherein the calibration output is a first calibration output, the calibration circuit has a second calibration output coupled to the DTC control input; and
wherein the DTC includes:
a set of main delay elements coupled to the DTC output, each main delay element having a main control terminal coupled to the DTC control input; and
a set of auxiliary delay elements coupled to the DTC output, each auxiliary delay element having an auxiliary control terminal coupled to the DTC calibration input, and each auxiliary delay element controllable to combine with a respective one of the main delay elements to set a delay between the DTC clock input and the DTC output.

19. The apparatus of claim 18, wherein the calibration circuit is configurable to:
receive a clock signal at the first calibration control input;
receive a residual signal at the second calibration control input;
responsive to a time difference between a first edge of the clock signal and a second edge of a delayed version of the clock signal and the residual signal provide a first calibration signal including a correction code at the first calibration output; and
responsive to at least one of the time difference or the residual signal, provide a second calibration signal representing a main code at the second calibration output.

20. The apparatus of claim 19, wherein the DTC has a second DTC calibration input, and the DTC includes a gain control circuit coupled to the DTC output, the gain control circuit having a control terminal coupled to the second DTC calibration input; and
wherein the calibration circuit has a third calibration output coupled to the second DTC calibration input, and the calibration circuit is configurable to, responsive to the time difference and the residual signal, a third calibration signal including a gain code at the second calibration output.

21. The apparatus of claim 20, wherein the calibration circuit is configurable to:
generate an error signal representing the time difference;
generate a first filtered error signal by performing a first filter operation on the error signal;
generate a second filtered error signal by performing a second filter operation on the error signal;
generate a third filtered error signal by performing a third filter operation on the error signal;
generate the gain code responsive to a first correlation between the first filtered error signal and the residual signal;
generate an adjustment signal responsive to a second correlation between the second filtered error signal and the residual signal;
generate the main code and a compensated residual signal responsive to the adjustment signal and the residual signal; and
generate the correction code responsive to a third correlation between the third filtered error signal and the compensated residual signal.

* * * * *